(12) United States Patent
Suzuki

(10) Patent No.: US 9,666,741 B2
(45) Date of Patent: *May 30, 2017

(54) POWER GENERATING APPARATUS AND POWER GENERATING SYSTEM EQUIPPED WITH SUCH POWER GENERATING APPARATUS

(71) Applicant: FUJITSU LIMITED, Kawasaki-shi (JP)

(72) Inventor: Takashi Suzuki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/492,665

(22) Filed: Sep. 22, 2014

(65) Prior Publication Data

US 2015/0059823 A1    Mar. 5, 2015

Related U.S. Application Data

(60) Division of application No. 13/403,207, filed on Feb. 23, 2012, now Pat. No. 8,872,017, which is a
(Continued)

(30) Foreign Application Priority Data

Aug. 26, 2009 (JP) ................. 2009-195404

(51) Int. Cl.
*H01L 35/28* (2006.01)
*H01L 35/30* (2006.01)
(Continued)

(52) U.S. Cl.
CPC ........ *H01L 31/05* (2013.01); *H01L 31/02021* (2013.01); *H01L 31/042* (2013.01);
(Continued)

(58) Field of Classification Search
CPC ..... H01L 31/0504; H01L 35/32; H01L 35/02; H01L 23/3672; H01L 31/052; H01L 23/367; F28F 13/00
(Continued)

(56) References Cited

U.S. PATENT DOCUMENTS 3,956,017 A    5/1976 Shigemasa
4,175,249 A *  11/1979 Gruber .................. G05F 1/67
                                                        136/293
(Continued)

FOREIGN PATENT DOCUMENTS

FR    2925225 A1    6/2009
JP    57139974 A    8/1982
(Continued)

OTHER PUBLICATIONS

International Search Report mailed Sep. 28, 2010 in counterpart application No. PCT/JP2010/061413.
(Continued)

*Primary Examiner* — Luan Van
*Assistant Examiner* — Angelo Trivisonno
(74) *Attorney, Agent, or Firm* — Kratz, Quintos & Hanson, LLP

(57) ABSTRACT

A power generating apparatus according to an aspect of the invention includes a plurality of pn stacks, each formed by stacking a p-type semiconductor layer and an n-type semiconductor layer one on top of the other, and a mode switching unit which effects switching to a photovoltaic power generation mode or a thermal power generation mode by connecting the plurality of pn stacks with each other. The mode switching unit effects switching to the photovoltaic power generation mode by connecting the p-type semiconductor layers in parallel with each other and the n-type semiconductor layers in parallel with each other between the
(Continued)

plurality of pn stacks. The mode switching unit effects switching to the thermal power generation mode by connecting the p-type semiconductor layer and the n-type semiconductor layer 11b in series between different ones of the pn stacks.

27 Claims, 22 Drawing Sheets

Related U.S. Application Data continuation of application No. PCT/JP2010/061413, filed on Jul. 5, 2010.

(51) Int. Cl.
    *H01L 31/00*     (2006.01)
    *H01L 31/042*     (2014.01)
    *H02N 6/00*     (2006.01)
    *H01L 31/05*     (2014.01)
    *H01L 31/02*     (2006.01)
    *H02S 40/44*     (2014.01)

(52) U.S. Cl.
    CPC .............. *H01L 35/28* (2013.01); *H02S 40/44* (2014.12); *Y02E 10/50* (2013.01); *Y02E 10/60* (2013.01)

(58) Field of Classification Search
    USPC .................... 136/200, 212, 205, 246, 244
    See application file for complete search history.

(56) References Cited

U.S. PATENT DOCUMENTS

| | | | | |
|---|---|---|---|---|
| 4,361,717 | A * | 11/1982 | Gilmore | F24J 2/07 136/246 |
| 4,710,588 | A | 12/1987 | Ellion | |
| 5,288,336 | A * | 2/1994 | Strachan | H01L 35/32 136/200 |
| 5,921,087 | A * | 7/1999 | Bhatia | F25B 21/02 136/203 |
| 6,162,985 | A | 12/2000 | Parise | |
| 6,449,437 | B1 | 9/2002 | Ogawa | |
| 6,583,522 | B1 * | 6/2003 | McNulty | H01L 31/02021 307/71 |
| 8,420,926 | B1 * | 4/2013 | Reedy | H01L 31/052 136/248 |
| 8,872,017 | B2 * | 10/2014 | Suzuki | H01L 31/02021 136/205 |
| 2003/0042497 | A1 | 3/2003 | Span | |
| 2006/0225782 | A1 * | 10/2006 | Berke | B82Y 10/00 136/252 |
| 2006/0237730 | A1 * | 10/2006 | Abramov | H01L 23/38 257/81 |
| 2008/0053514 | A1 | 3/2008 | Micallef | |
| 2008/0295883 | A1 * | 12/2008 | Ducellier | G05B 15/02 136/246 |
| 2010/0006139 | A1 * | 1/2010 | Zahuranec | F24J 2/07 136/246 |
| 2011/0083711 | A1 | 4/2011 | Plissonnier et al. | |

FOREIGN PATENT DOCUMENTS

| | | |
|---|---|---|
| JP | 58-78066 A | 5/1983 |
| JP | 05-095137 A | 4/1993 |
| JP | 05095137 A | 4/1993 |
| JP | 09-015353 A | 1/1997 |
| JP | 2001-119063 A | 4/2001 |
| JP | 2007-081097 A | 3/2007 |
| JP | 2009-141079 A | 6/2009 |
| WO | 9850964 A1 | 11/1998 |

OTHER PUBLICATIONS

Notice of Preliminary Rejection mailed Nov. 14, 2013 by the Korean Intellectual Property Office in counterpart application No. 10-2012-7001665 with English translation.

English translation of Notice of Reasons for Rejection mailed Oct. 22, 2013 from the Japanese Patent Office in counterpart application No. 2009-195404.

First Office Action issued Dec. 3, 2013 from the State Intellectual Property Office of the People∝s Republic of China in counterpart application No. 201080036838.6 with English translation.

Notice of Preliminary Rejection mailed May 28, 2013 from the Korean Intellectual Property Office in counterpart application No. 10-2012-7001665 with English translation.

Written Opinion of the International Searching Authority mailed on Sep. 28, 2010, in the international application No. PCT/JP2010/061413.

Extended European Search Report, for the Corresponding EP Application No. 10811612, mailed on Mar. 4, 2015.

* cited by examiner

FIG. 3(A)
FIG. 3(B)
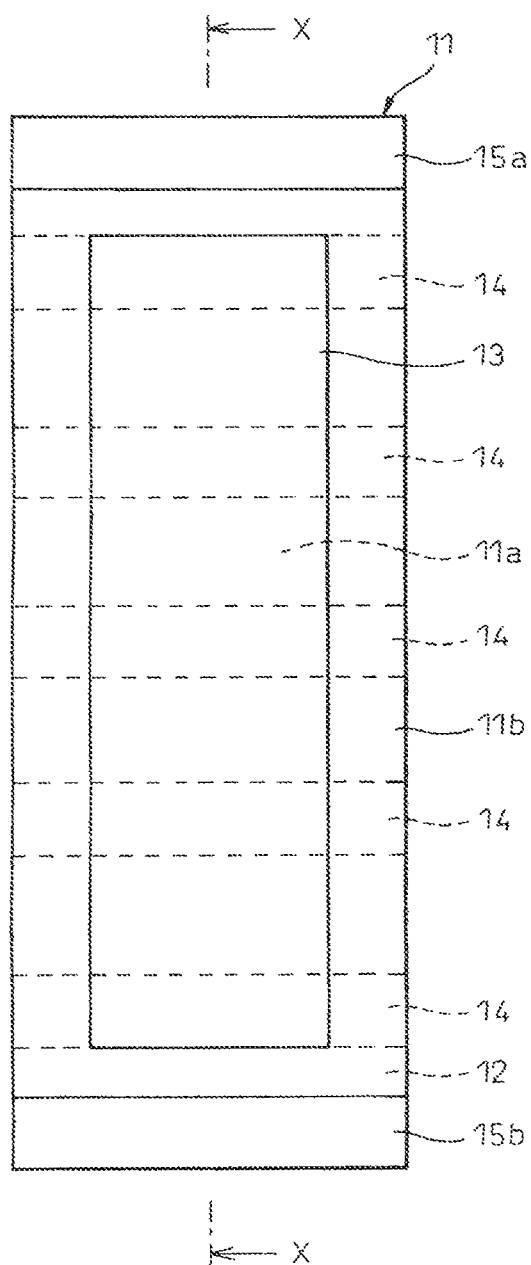
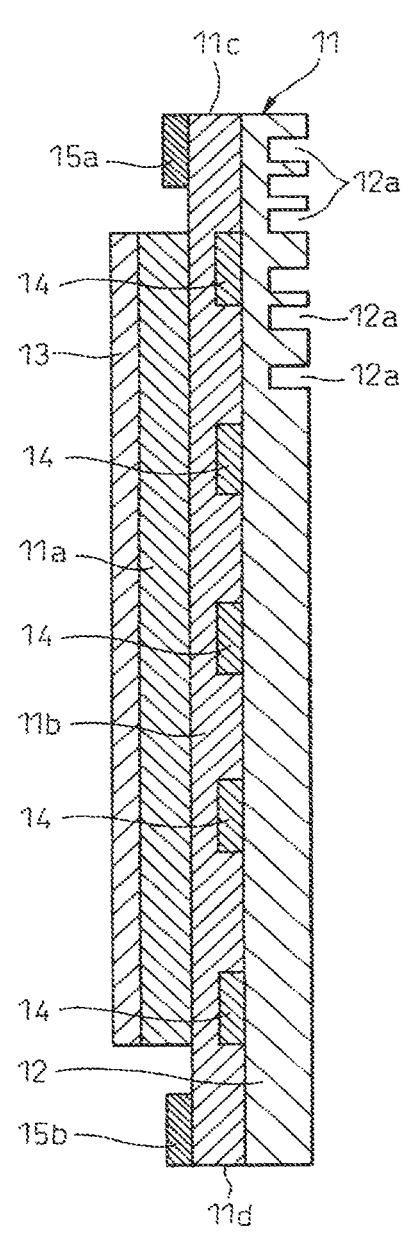

FIG.8

| METAL | THERMAL CONDUCTIVITY W/mK |
|---|---|
| Ag | 420 |
| Cu | 398 |
| Au | 320 |
| Al | 236 |
| Pt | 70 |
| In | 82 |
| Sn | 65 |
| Pd | 72 |
| CNT | 3000~5500 |
| Diamond | 1000~2000 |

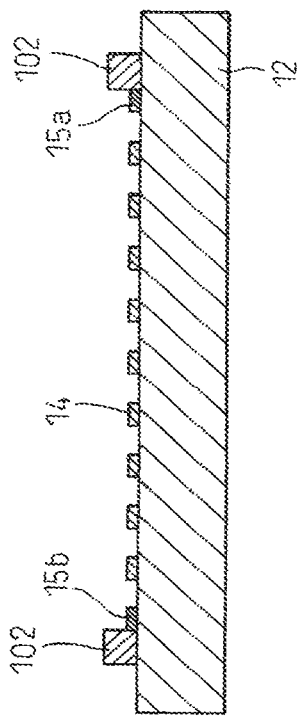
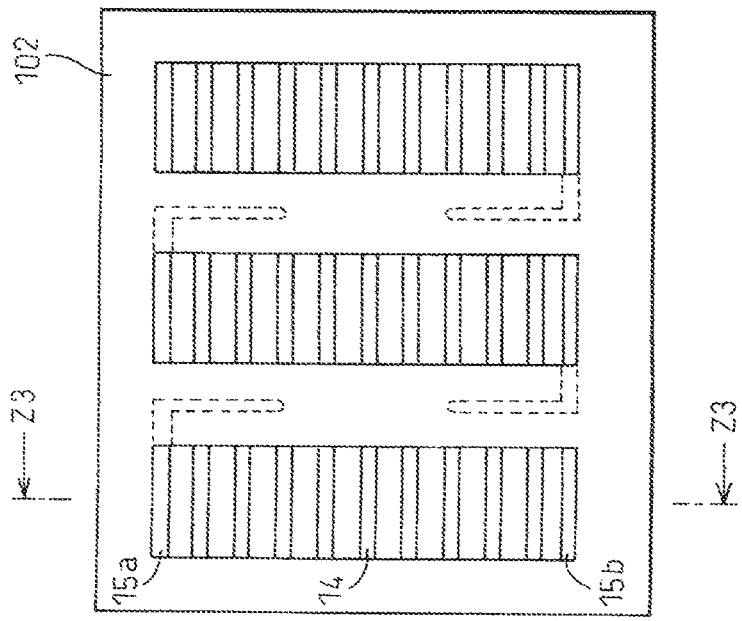

POWER GENERATING APPARATUS AND POWER GENERATING SYSTEM EQUIPPED WITH SUCH POWER GENERATING APPARATUS

CROSS-REFERENCE TO RELATED APPLICATIONS

This application is a divisional application of U.S. application Ser. No. 13/403,207, filed on Feb. 23, 2012, which is a continuation patent application of PCT/JP2010/061413, which claims priority to Japanese Patent Application No. 2009-195404, filed on Aug. 26, 2009. The entire contents of those applications are incorporated herein by reference.

TECHNICAL FIELD

The present invention relates to a power generating apparatus and a power generating system equipped with such a power generating apparatus.

BACKGROUND ART

Solar cells that generate power by converting light energy into electric energy nave long been used. The main source of the light energy is sunlight.

For example, a solar cell is formed by stacking a p-type semiconductor layer and an n-type semiconductor layer one on top of the other. When the solar cell is exposed to light such as sunlight, electron-hole pairs are generated at the on junction, and an electromotive force is thus generated.

Generally, solar cells are formed, using inorganic-based or organic-based materials. For inorganic-based solar cells, mostly Si is used as the inorganic semiconductor material. The polarity type, p or n, is controlled by adding impurities to Si.

For organic-based solar cells, organic compounds such as organic dyes, organic polymers, etc. or carbon nanotubes are used as the organic semiconductor material. Solar cells are formed by depositing such materials on a substrate made of an electrically insulating material such as glass.

[Patent Document 1] Japanese Unexamined Patent Publication No. S58-78066

[Patent Document 2] Japanese Unexamined Patent Publication No. H09-15353

[Patent Document 3] Japanese Unexamined Patent Publication No. 2007-81097

SUMMARY

Solar cells that utilize sunlight are unable to generate power in the nighttime when sunlight is not available. Even in the daytime, depending on the weather conditions such as rainy or cloudy, solar cells may not be able to generate sufficient power because of weak sunlight.

There is also a need for a power generating apparatus having a simple structure.

According to an aspect of the embodiment disclosed in this specification, there is provided a power generating apparatus which includes a plurality of pn stacks, each formed by stacking a p-type semiconductor layer and an n-type semiconductor layer one on top of the other, and a mode switching unit which effects switching to a photovoltaic power generation mode or a thermal power generation mode by connecting the plurality of pn stacks with each other.

The object and advantages of the embodiments will be realized and attained by means of the elements and combinations particularly pointed, out in the claims.

It is to be understood that both the foregoing general description and the following detailed description are exemplary and explanatory and are not restrictive of the invention, as claimed.

BRIEF DESCRIPTION OF THE DRAWINGS

FIG. 3A is an enlarged plan view of a pn stack of FIG. 2, and FIG. 3B is a cross-sectional view taken along line X-X in FIG. 3A.

FIG. 8 is a list of materials to be used for forming end electrodes in the pn stack of FIG. 7 and their thermal conductivities.

FIG. 19(A) is a plan view and FIG. 19(B) is an enlarged cross-sectional view taken along line Z2-Z2 in FIG. 19(A).

FIG. 22 is a diagram (part 4) illustrating a fabrication process according to the second embodiment of the fabrication method for the power generating apparatus disclosed in this specification: FIG. 22(A) is a plan view, and FIG. 22(B) is an enlarged cross-sectional view taken along line Z3-Z3 in FIG. 22(A).

DESCRIPTION OF THE EMBODIMENTS

[a] First Embodiment

A first preferred embodiment of a power generating system disclosed in this specification will be described below with reference to drawings. It will, however, be noted that the technical scope of the present invention is not limited to the specific embodiments described herein but extends to the inventions described in the appended claims and their equivalents.

Figure 1:
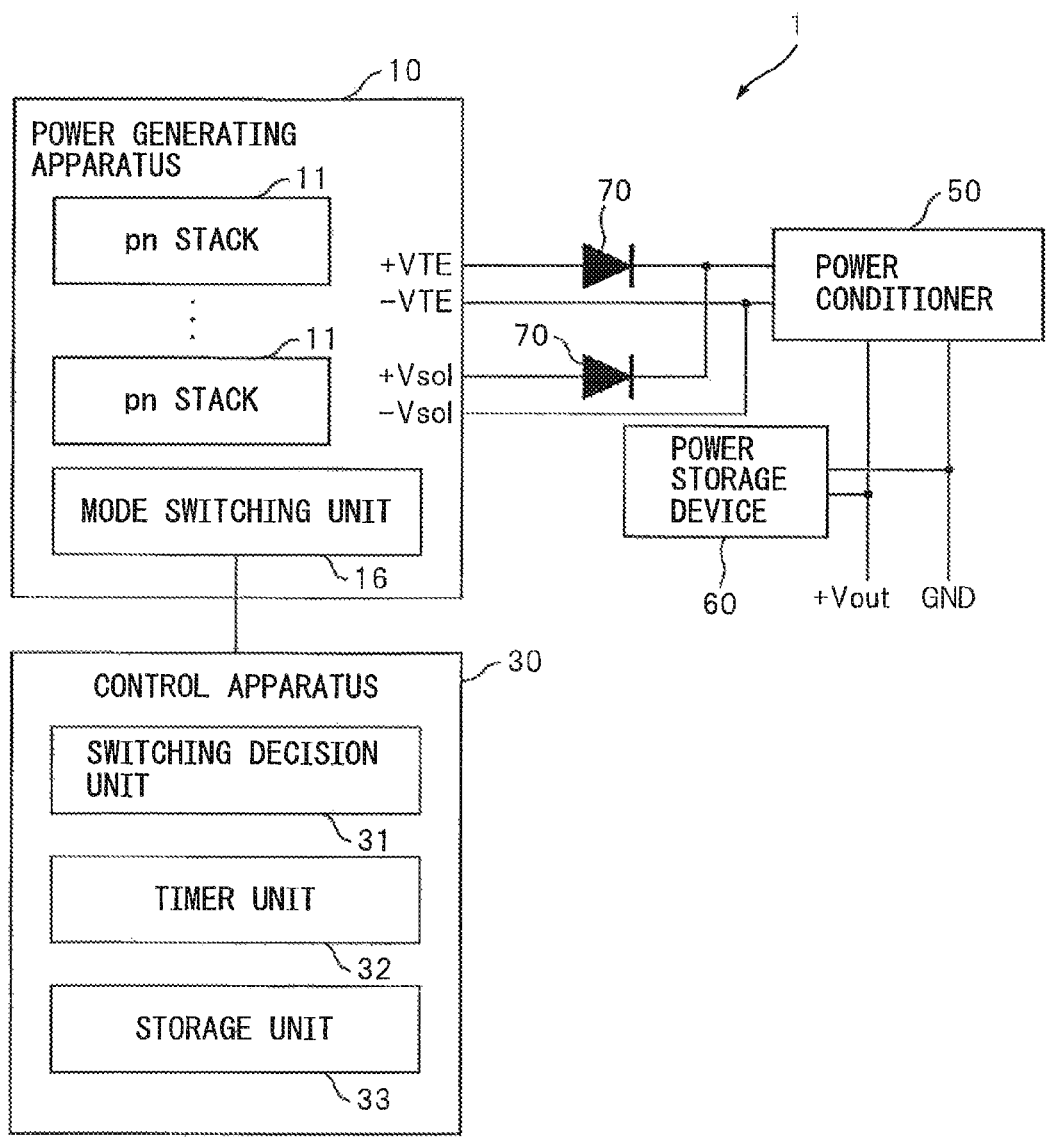
FIG. 1 is a system configuration diagram of a first embodiment of a power generating system disclosed in this specification.
Figure 4:
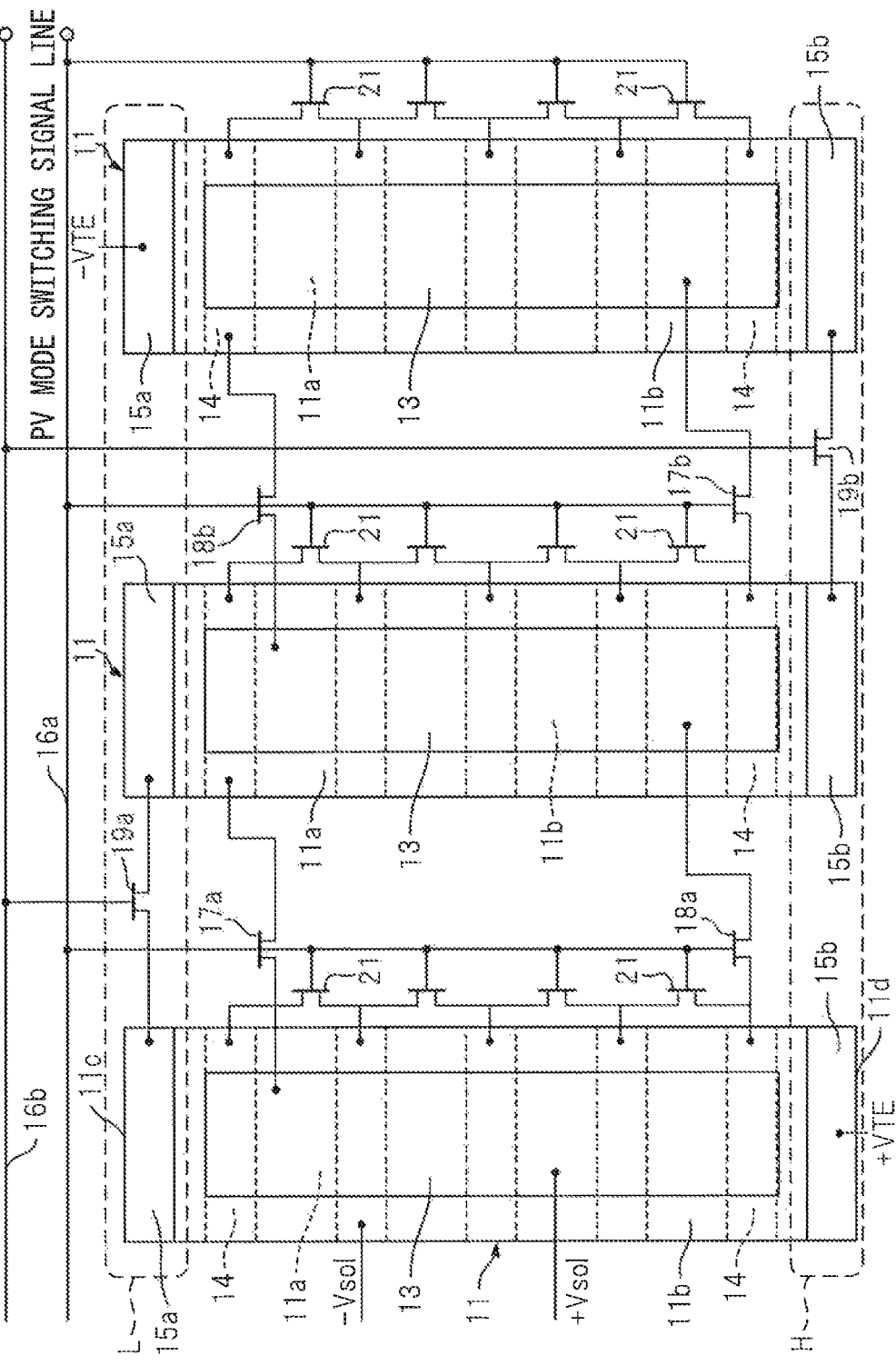
FIG. 4 is a diagram illustrating a mode switching unit and the pn stack array in the power generating apparatus depicted in FIG. 1.

FIG. 1 is a diagram illustrating the first embodiment of the power generating system disclosed in this specification. FIG. 2 is a diagram illustrating an arrangement of a pn stack array in a power generating apparatus depicted in FIG. 1. FIG. 3A is an enlarged plan view of a pn stack in FIG. 2, and FIG. 3B is a cross-sectional view taken along line X-X in FIG. 3A. FIG. 4 is a diagram illustrating a mode switching unit and the pn stack array in the power generating apparatus depicted in FIG. 1.

As illustrated in FIG. 1, the power generating system 1 includes, in addition to the power generating apparatus 10, a control apparatus 30 for controlling the power generating apparatus 10.

The power generating apparatus 10 may include a plurality of pn stacks 11, each formed by stacking a p-type semiconductor layer 11a and an n-type semiconductor layer 11b one on top of the other, and a mode switching unit 16 which effects switching to a photovoltaic power generation mode or a thermal power generation mode by connecting the plurality of pn stacks with each other.

In the photovoltaic power generation mode, the power generating apparatus 10 performs photovoltaic power generation by converting light energy into electric energy. The power generating apparatus 10 can also generate power in the thermal power generation mode by converting thermal energy into electric energy.

For example, in the daytime when sunlight is available, the power generating apparatus 10 may generate power in the photovoltaic power generation mode, and in the nighttime when sunlight is not available, it may generate power in the thermal power generation mode.

The control apparatus 30 may include a switching decision unit 31 which makes a decision to switch the power generating apparatus 10 to the photovoltaic power generation mode or to the thermal power generation mode and instructs the mode switching unit 16 to effect the mode switching. The control apparatus 30 may further include a timer unit 32 which provides timing for the switching decision unit 31 to make a mode switching decision, and a storage unit 33 which stores information based on which the switching decision unit 31 makes a decision to switch to the photovoltaic power generation mode or to the thermal power generation mode.

Information on the latitude, altitude, etc. at which the power generating system 1 is installed, the probability of sunshine based on past statistics, and the dates and times at which the amount of photovoltaic power generation is expected to exceed the amount of thermal power generation can be stored in the storage unit 33.

In response to the timing provided by the timer unit 32, and based on the information stored in the storage unit 33, the switching decision unit 31 makes a decision to switch the power generating apparatus 10 to the photovoltaic power generation mode or to the thermal power generation mode.

The control apparatus 30 may be implemented using, for example, a computer. The storage unit 33 may be implemented using a semiconductor storage device, such as a ROM or a flash memory, or a magnetic storage device or the like.

As depicted in FIG. 1, the power generated by the power generating apparatus 10 in the photovoltaic power generation mode is output from +Vsol and −Vsol and supplied via a rectifier 70 to a power conditioner 50. Since the power generated in the photovoltaic power generation mode varies with the intensity of incident light, the output power is regulated, by the power conditioner 50 to produce a constant output voltage +Vout which is supplied to a load.

A power storage device 60 connected in parallel with the output of the power conditioner 50 serves to further even out the fluctuations occurring in the photovoltaic power generation due to the weather conditions.

On the other hand, the power generated by the power generating apparatus 10 in the thermal power generation mode is output from +VTE and −VTE and supplied via a rectifier 70 to the power conditioner 50 whose output is coupled to the load.

The rectifier 70 prevents the power generated in the photovoltaic power generation mode from flowing back to VTE+. Likewise, the rectifier 70 prevents the power generated in the thermal power generation mode from, flowing back to +Vsol.

The power storage device 60 may be connected between the power generating apparatus 10 and the power conditioner 50.

The power generating apparatus 10 will be described in further detail below.

As depicted in FIG. 2, each pn stack 11 has an elongated rectangular shape. The p-type and n-type semiconductor layers 11a and 11b forming each pn stack 11 are also of an elongated rectangular shape. The p-type and n-type semiconductor layers 11a and 11b are formed one on top of the other with their longitudinal directions parallel to each other.

Each pn stack 11 includes an electrically insulating substrate 12 identical in shape to the lower semiconductor layer. In each pn stack 11, the p-type semiconductor layer 11a and the n-type semiconductor layer 11b are formed one on too of the other on the substrate 12.

In the power generating apparatus 10, the plurality of pn stacks 11 are arranged in a single row in such a manner as to be spaced apart from one another in a width direction. The width direction refers to the direction orthogonal to the longitudinal direction of each pn stack 11.

As depicted in FIG. 2, the order in which the p-type semiconductor layer 11a and the n-type semiconductor layer 11b are stacked may differ between adjacent pn stacks 11.

Figure 2A:
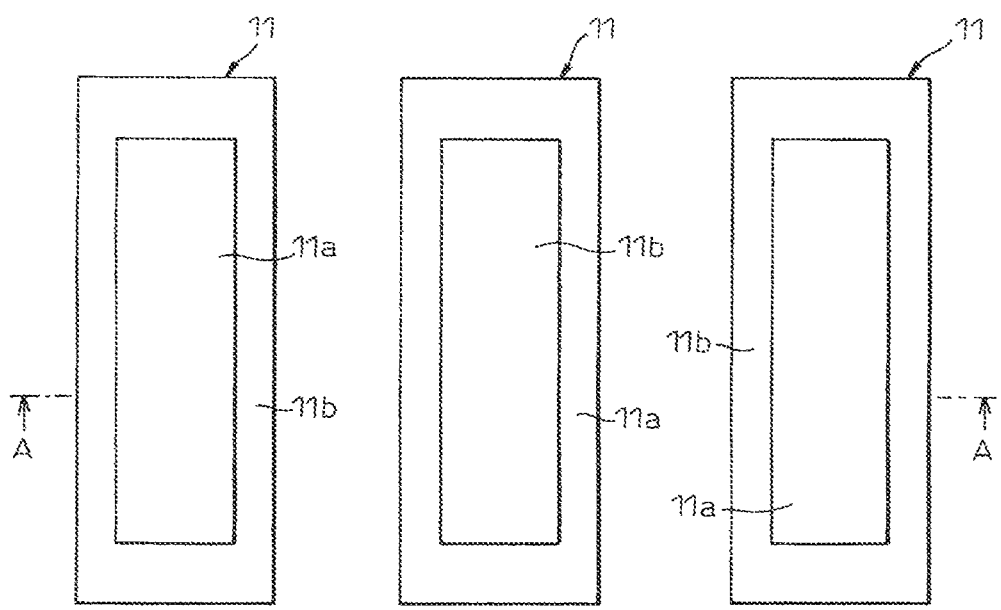
FIG. 2A is a plan view illustrating an arrangement of a pn stack array in a power generating apparatus depicted in FIG. 1.
Figure 2B:
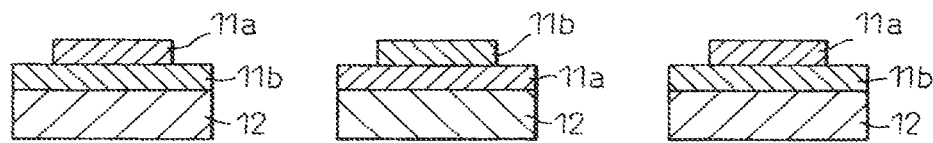
FIG. 2B is a cross-sectional view taken along line A-A in FIG. 2A.

In the pn stack 11 at the right in FIG. 2B, it is preferable that the n-type semiconductor layer 11b formed directly on the substrate 12 is larger in size than the p-type semiconductor layer 11a stacked on top thereof. On the other hand, in the pn stack 11 in the center of FIG. 2A, it is preferable that the p-type semiconductor layer 11a formed directly on the substrate 12 is larger in size than the n-type semiconductor layer 11b stacked on top thereof.

In the photovoltaic power generation mode, each pn stack 11 converts the light energy into electric energy at the pn junction formed between the p-type semiconductor layer 11a and the n-type semiconductor layer 11b.

On the other hand, in the thermal power generation mode, a temperature difference is set up between the longitudinal ends of the p-type semiconductor layer 11a or the n-type semiconductor layer 11b in each pn stack 11, thereby generating an electromotive force in the longitudinal direction and thus converting the thermal energy into electric energy.

For simplicity of illustration, FIGS. 2A and 2B have depicted three pn stacks 11 arranged in a single row, but a larger number of pn stacks 11 may be arranged in a single row. Further, in the power generating apparatus 10, the plurality of pn stacks 11 may be arranged in a two-dimensional array.

Next, the structure of the pn stack 11 will be described in further detail with reference to FIGS. 3A and 35. The on stack 11 depicted in FIGS. 3A and 3B is formed by stacking the p-type semiconductor layer 11a on top of the n-type semiconductor layer 11b, but the description hereinafter given essentially applies to the pn stack 11 formed by stacking the n-type semiconductor layer 11b on top of the p-type semiconductor layer 11a.

The pn stack 11 includes, in addition to the p-type semiconductor layer 11a, n-type semiconductor layer 11b, and substrate 12 described above, a blanket electrode as a top electrode 13 formed over the entire top surface of the p-type semiconductor layer 11a. The top electrode 13 is transparent to sunlight. The pn stack 11 is oriented with its top electrode 13 facing toward the sun.

The pn stack 11 further includes bottom electrodes 14 formed in a comb-like electrode structure underneath the n-type semiconductor layer 11b. The plurality of bottom electrodes 14 are arranged spaced apart from one another in the longitudinal direction of the n-type semiconductor layer 11b.

Further, the pn stack 11 is provided, at both longitudinal ends of the n-type semiconductor layer 11b, with end electrodes 15a and 15b which are connected to the semiconductor layers in other pn stacks or are used to take out thermally generated power. The end electrodes 15a and 15b are formed on the portions of the n-type semiconductor layer 11b that are not covered with the p-type semiconductor layer 11a.

Further, the substrate 12 is formed with a plurality of slits 12a for preventing thermal conduction within the substrate 12. As illustrated in FIG. 3B, the density of the plurality of slits 12a gradually becomes larger toward one longitudinal end 11d of the pn stack 11. Stated another way, the density of the slits 12a gradually becomes smaller toward the other longitudinal end 11c of the pn stack 11.

When using the pn stack 11 as a thermoelectric device, a temperature difference is set up between the longitudinal ends of the pn stack 11. For example, the region where the end electrode 15a is formed is set up as the low temperature region, and the region where the end electrode 15b is formed is set up as the high temperature region. In this case, the greater the temperature difference between the longitudinal ends of the n-type semiconductor layer 11b to which the end electrodes 15a and 15b are respectively connected, the greater is the electromotive force generated within the n-type semiconductor layer 11b.

In view of this, the plurality of slits 12a are provided each extending in a direction orthogonal to the longitudinal direction. For example, when the region where the end electrode 15b is formed is set up as the nigh temperature region, the provision of these slits 12a serves to prevent the thermal energy at the end electrode 15b side from being concurred through the substrate 12 to the end electrode 15a side where the low temperature region is formed.

An inorganic semiconductor material composed principally of Si or Ge may be used as the material for forming the p-type and n-type semiconductor layers 11a and 11b.

From the standpoint of reducing manufacturing costs, it is preferable that Poly-Si thin films formed on the substrate 12 are used as the p-type and n-type semiconductor layers 11a and 11b.

If a p-type Si substrate is used as the substrate 12, the substrate 12 can be used as the p-type semiconductor layer. Similarly, if an n-type Si substrate is used as the substrate 12, the substrate 12 can be used as the n-type semiconductor layer. In particular, if a single-crystalline or polycrystalline Si substrate is used as the substrate 12, the performance of photovoltaic power generation can be enhanced.

As the p-type dopant to be added to the p-type semiconductor layer 11a, use may be made, for example, of B, Al, Ga, or In. As the n-type dopant to be added to the n-type semiconductor layer 11b, use may be made, for example, of P, As, or Sb.

As the material for forming the top electrode 13, use may be made, for example, of ITO, ZnO, or $TiO_2$.

As the material for forming the substrate 12, use may be made, for example, of glass, alumina, or quartz.

Next, the mode switching unit 16 in the power generating apparatus 10 will be described in further detail with reference to FIG. 4. In FIG. 4, three pn stacks 11 are arranged spaced apart from one another in the width direction, and the mode switching unit 16 switches the power generating apparatus 10 between the photovoltaic power generation mode and the thermal power generation mode by changing the connections between, the plurality of pn stacks 11.

The mode switching unit 16 effects switching to the photovoltaic power generation mode by connecting the p-type semiconductor layers 11a in parallel with each other and the n-type semiconductor layers 11b in parallel with each other between the plurality of pn stacks 11.

More specifically, as depicted in FIG. 4, the mode switching unit 16 includes first switching devices 17a and 17b for connecting the p-type semiconductor layers 11a in parallel with each other, and second switching devices 18a and 18b for connecting the n-type semiconductor layers 11b in parallel with each other.

The first switching device 17a connects the p-type semiconductor layer 11a at the left in FIG. 4 to the p-type semiconductor layer 11a in the center of FIG. 4 via the top electrode 13 and the bottom electrode 14. The first switching device 17b connects the p-type semiconductor layer 11a in the center of FIG. 4 to the p-type semiconductor layer 11a at the right in FIG. 4 via the top electrode 13.

The second switching device 18a connects the re-type semiconductor layer 11b at the left in FIG. 4 to the n-type semiconductor layer 11b in the center of FIG. 4 via the top electrode 13. The second switching device 18b connects the n-type semiconductor layer 11b in the center of FIG. 4 to the n-type semiconductor layer 11b at the right in FIG. 4 via the top electrode 13 and the bottom electrode 14.

The first switching devices 17a and 17b and the second switching devices 18a and 18b are connected to one common PV mode switching signal line 16a for switching to the photovoltaic power generation mode. The first switching devices 17a and 17b and the second switching devices 18a and 18b conduct when a signal is applied from the PV mode switching signal line 16a. The PV mode switching signal line 16a is connected to the mode switching unit 16.

The mode switching unit 16 effects switching to the thermal power generation mode by connecting the p-type semiconductor layer 11a and the n-type semiconductor layer 11b in series between adjacent ones of the pn stacks 11.

More specifically, the mode switching unit 16 includes third switching devices 19a and 19b each for connecting the p-type semiconductor layer 11a and the re-type semiconductor layer 11b between adjacent pn stacks 11 via the end electrodes 15a or 15b.

The third switching device 19a connects the re-type semiconductor layer 11b at the left in FIG. 4 to the p-type semiconductor layer 11a in the center of FIG. 4 via the end electrodes 15a. The third switching device 19b connects the p-type semiconductor layer 11a in the center of FIG. 4 to the n-type semiconductor layer 11b at the right in FIG. 4 via the end electrodes 15b.

The third switching devices 19a and 19b are connected to a TE mode switching signal line 16b for switching the power generating apparatus 10 to the thermal power generation mode. The third switching devices 19a and 19b conduct when a signal is applied from the TE mode switching signal line 16b. The TE mode switching signal line 16b is connected to the mode switching unit 16.

Each pn stack 11 includes fifth switching devices 21 for interconnecting the plurality of bottom electrodes 14. As depicted in FIG. 4, the plurality of fifth switching devices 21 are connected in parallel in each on stack 11, and when the fifth switching devices conduct, the plurality of bottom electrodes 14 are connected in parallel with each other.

The fifth switching devices 21 are connected to the PV mode switching signal line 16a for switching the power generating apparatus 10 to the photovoltaic power generation mode. The fifth switching devices 21 conduct when a signal is applied from the PV mode switching signal line 16a.

In the present embodiment, the first switching devices 17a and 17b, the second switching devices 18a and 18b, the third second switching devices 13a and 19b, and the fifth switching devices 21 are normally-off transistors. The term "normally-off" means that when no signal is applied from the PV mode switching signal line 16a or the TB mode switching signal line 16b, the transistor is nonconducting, but when a signal is applied, it becomes conducting. Alternatively, a relay or a mechanical switch may be used as the switching device.

Next, a description will be given of the operation when the power generating apparatus 10 generates power in the photovoltaic power generation mode.

First, in the photovoltaic power generation mode, the mode switching unit 16 outputs a signal on the PV mode switching signal line 16a, causing the first switching devices 17a and 17b, the second switching devices 18a and 18b, and the fifth switching devices 21 to conduct. On the other hand, since no signal is output on the TE mode switching signal line 16b, the third second switching devices 19a and 19b remain nonconducting.

When the first switching devices 17a and 17b conduct, the p-type semiconductor layers 11a are connected in parallel with each other between, the plurality of pn stacks 11. Further, when the second, switching devices 18a and 18b conduct, the n-type semiconductor layers 11b are connected in parallel with each other between the plurality of pn stacks 11.

When the fifth switching devices 21 conduct, the plurality of bottom electrodes 14 in each on stack 11 are connected in parallel with each other.

When the upper surface of each pn stack 11 is exposed to light such as sunlight, the pn stack 11 generates power by converting the light energy into electric energy. The power thus generated is output from the output terminals +Vsol and −Vsol.

Next, a description will be given of the operation when the power generating apparatus 10 generates power in the thermal power generation mode.

First, in the thermal power generation mode, the mode switching unit 16 outputs a signal on the TE mode switching signal line 16b, causing the third switching devices 19a and 19b to conduct. On the other hand, since no signal is output on the PV mode switching signal line 16a, the first switching devices 17a and 17b, the second switching devices 18a and 18b, and the fifth switching devices 21 remain nonconducting.

When the third switching devices 19a and 19b conduct, the p-type semiconductor layer 11a and the n-type semiconductor layer 11b are connected in series between adjacent ones of the pn stacks 11.

Then, in each pn stack 11, a temperature difference is set up between the high temperature region H located at one longitudinal end 11d where the end electrode 15b is formed and the low temperature region L located at the other longitudinal end 11c.

When a temperature gradient is set up along the longitudinal direction of the p-type semiconductor layer 11a and the n-type semiconductor layer 11b, an electromotive force is generated by the Seebeck effect. The direction of the electromotive force associated with the temperature gradient is reversed between the p-type semiconductor layer 11a and the n-type semiconductor layer 11b. In the power generating apparatus 10, since the p-type semiconductor layer 11a and the n-type semiconductor layer 11b are connected in series, the direction of the electromotive force becomes the same between the semiconductor or layers, so that power can be generated. The power thus generated is output from the output terminals +VTE and −VTE.

The power generating system 1 using the power generating apparatus 10 can generate power, for example, in the photovoltaic power generation mode by utilizing sunlight in the daytime, and in the thermal power generation mode by utilising geothermal heat in the nighttime when sunlight is not available.

In the nighttime, the ground temperature is often higher than the atmospheric temperature. For example, when the pn stack 11 is placed horizontally on the ground, the temperature at the end electrode 15b side where the substrate 12 is not formed with the slits 12a is brought closer to the ground temperature and is thus held relatively high. On the other hand, the temperature at the end electrode 15a side where the substrate 12 is formed with the plurality of slits 12a is brought closer to the atmospheric temperature and is thus held relatively low, because the heat insulating effect of the slits 12a provides resistance to heat conduction from the ground. Power can be generated by thus forming a temperature gradient along the longitudinal direction of the pn stack 11.

In this way, the power generating system 1 can generate power around the clock, regardless of the weather.

According to the power generating system 1 of the present embodiment described above, light energy can be converted into electric energy in the thermal power generation mode. On the other hand, when the amount of available light energy is not sufficient, power can be generated in the thermal power generation, mode.

Further, since the same semiconductor layers are used not only as the photovoltaic power generating devices but also as the thermal power generating device, and since the power generation mode is switched by changing the electrical connections of the p-type and re-type semiconductor layers 11a and 11b between the respective pn stacks, the power generating system 1 can be achieved using a simple structure.

Furthermore, since the control apparatus 30 performs control to select the photovoltaic power generation mode or the thermal power generation mode, whichever is capable of generating a larger amount of power, efficient power generation can be achieved.

Next, a modified example of the above embodiment will be described below with reference to FIG. 5.

Figure 5A:
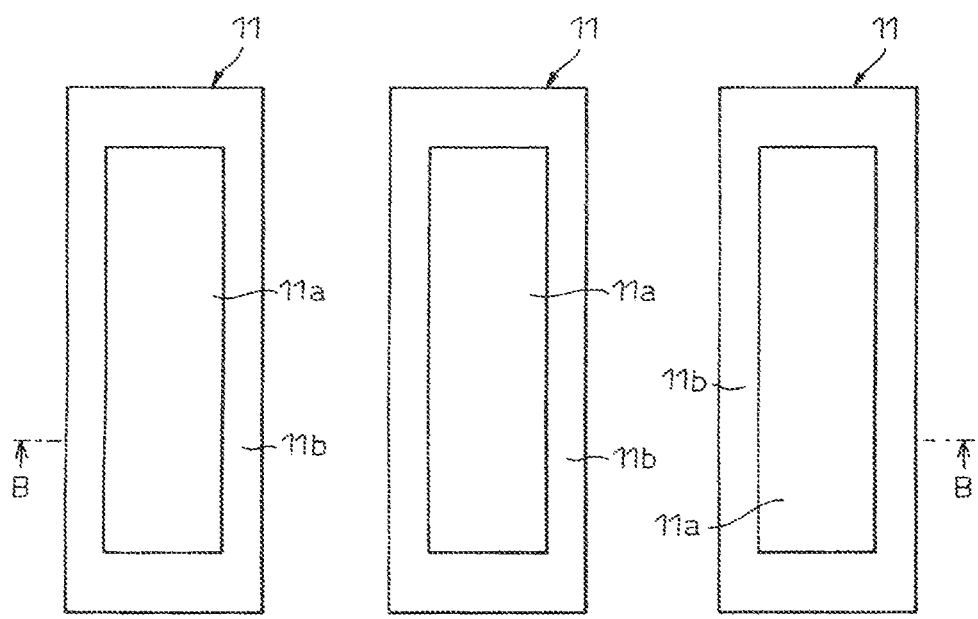
FIG. 5A is a plan view illustrating another arrangement example of the pn stack array.
Figure 5B:
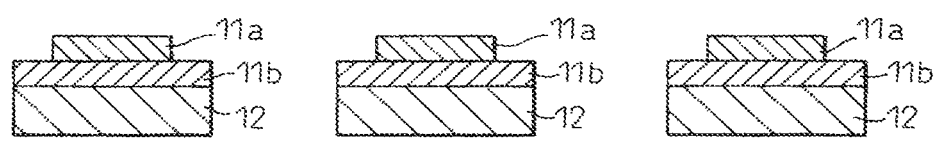
FIG. 5B is a cross-sectional view taken along line B-B in FIG. 5A.

In the power generating apparatus 10, the order in which the p-type semiconductor layer 11a and the n-type semiconductor layer 11b are stacked, may be made the same between adjacent ones of the pn stacks 11, as depicted in FIGS. 5A and 5B. In the example depicted in FIGS. 5A and 5B, three pn stacks 11 are arranged in a single row in the width direction, and each pn stack 11 is formed by stacking the p-type semiconductor layer 11a on top of the n-type semiconductor layer 11b.

In the photovoltaic power generation mode, the mode switching unit 16 connects the p-type semiconductor layers 11a in parallel with each other and the n-type semiconductor layers 11b in parallel with each other between, the plurality of pn stacks 11. In this respect, the modified example is the same as the above-described embodiment, except that the way of connecting the lines differs.

In the thermal power generation mode, the mode switching unit 16 connects the p-type semiconductor layer 11a and the n-type semiconductor layer 11b in series between, adjacent ones of the pn stacks 11. In this respect also, the modified example is the same as the above-described embodiment, except that the way of connecting the lines differs.

The modified example has the effect of simplifying the fabrication of the pn stacks, because all the pn stacks are identical in structure.

Next, second to eighth embodiments of the power generating system disclosed, in this specification will be described with reference to drawings. The detailed description of the first embodiment given above essentially applies to those parts of the second to eight embodiments that are not specifically described herein. Further, in FIGS. 6 to 14, the same component elements as those in FIGS. 1 to 4 are designated by the same reference numerals.

[b] Second Embodiment

Figure 6:
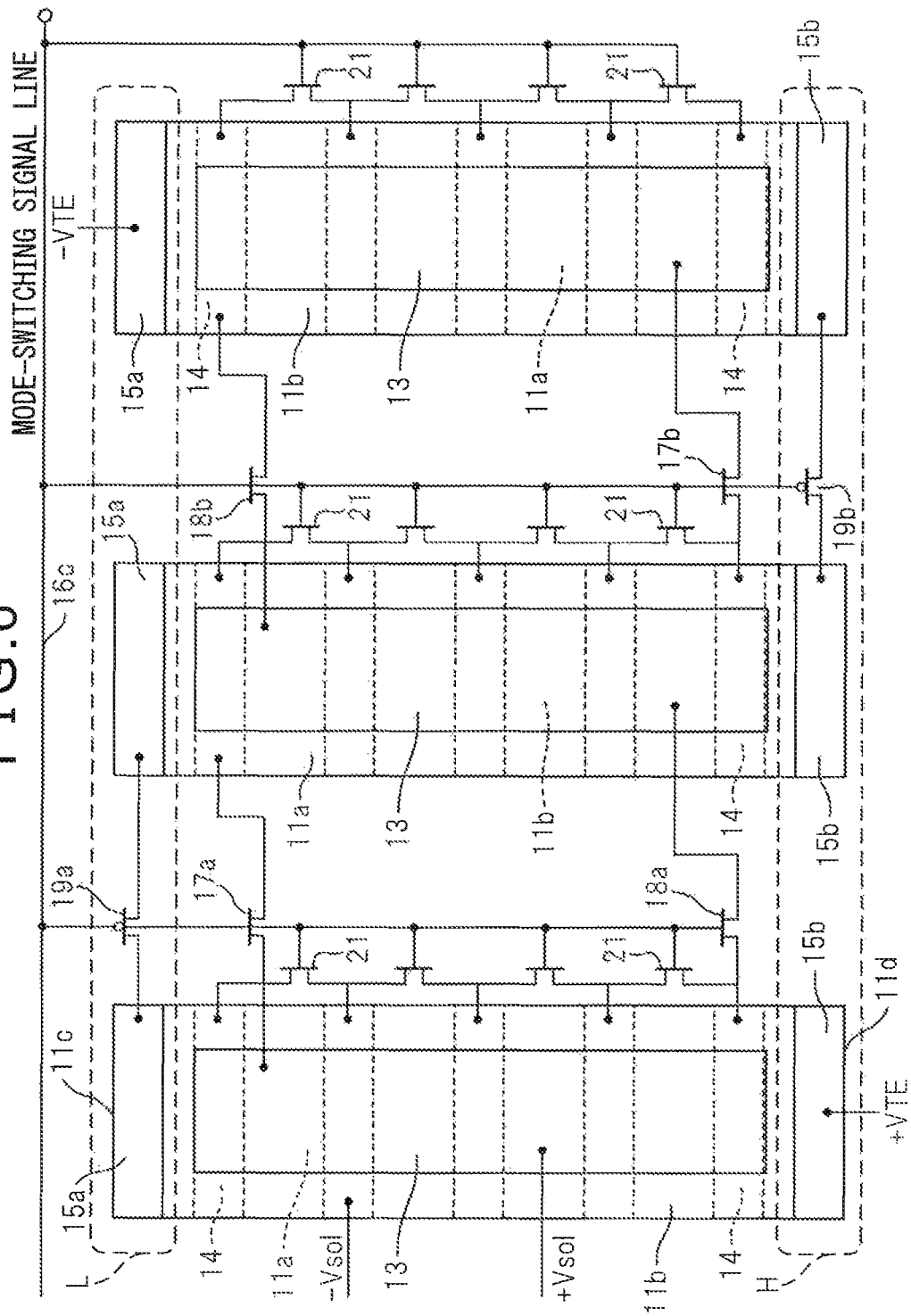
FIG. 6 is a diagram illustrating a mode switching unit and a pn stack array according to a second embodiment of the power generating system disclosed in this specification.

The second embodiment of the power generating system disclosed in this specification will be described below with, reference to FIG. 6. FIG. 6 is a diagram illustrating a mode switching unit and a pn stack array according to the second embodiment of the power generating system disclosed in this specification.

The power generating system of the present embodiment differs from the foregoing first embodiment in that the third switching devices 19 in the mode switching unit 16 are of normally-on type.

That is, the mode switching unit 16 includes the normally-off first switching devices 17a and 17b and second, switching devices 18a and 18b and the normally-on third switching devices 19a and 19b.

The first switching devices 17a and 17b, the second, switching devices 18a and 18b, and the third switching devices 19a and 19b are connected to one common mode-switching control signal line 16c. The mode-switching control signal line 16c is connected to the mode switching unit 16.

The term "normally-on" means that when no signal is applied from the mode-switching control signal line 16c, the transistor is conducting, but when a signal is applied, it becomes nonconducting.

Next, a description will be given of the operation when the power generating apparatus 10 of the present embodiment generates power in the photovoltaic power generation mode.

First, in the photovoltaic power generation mode, the mode switching unit 16 outputs a signal on the mode-switching signal line 16c, causing the first switching devices 17a and 17b, the second switching devices 18a and 18b, and the fifth switching devices 21 to conduct. On the other hand, the third second switching devices 19a and 19b become nonconducting.

When the upper surface of each pn stack 11 is exposed to light such as sunlight, the pn stack 11 generates power by converting the light energy into electric energy. The power thus generated is output from the output terminals +Vsol and −Vsol.

Next, a description will be given of the operation when the power generating apparatus 10 generates power in the thermal power generation mode.

First, in the thermal power generation mode, the mode switching unit 16 stops outputting a signal on the mode-switching signal line 16c, causing the third switching devices 19a and 19b to conduct. On the other hand, the first switching devices 17a and 17b, the second switching devices 18a and 18b, and the fifth switching devices 21 become nonconducting.

Then, in each pn stack 11, a temperature difference is set up between the high temperature region H located, at one longitudinal end 11d where the end electrode 15b is formed and the low temperature region L located at the other longitudinal end 11c. The power thus generated is output from the output terminals +VTE and −VTE.

According to the power generating system of the present embodiment described above, the number of connecting lines in the mode switching unit 16 can be reduced.

[c] Third Embodiment

Figure 7:
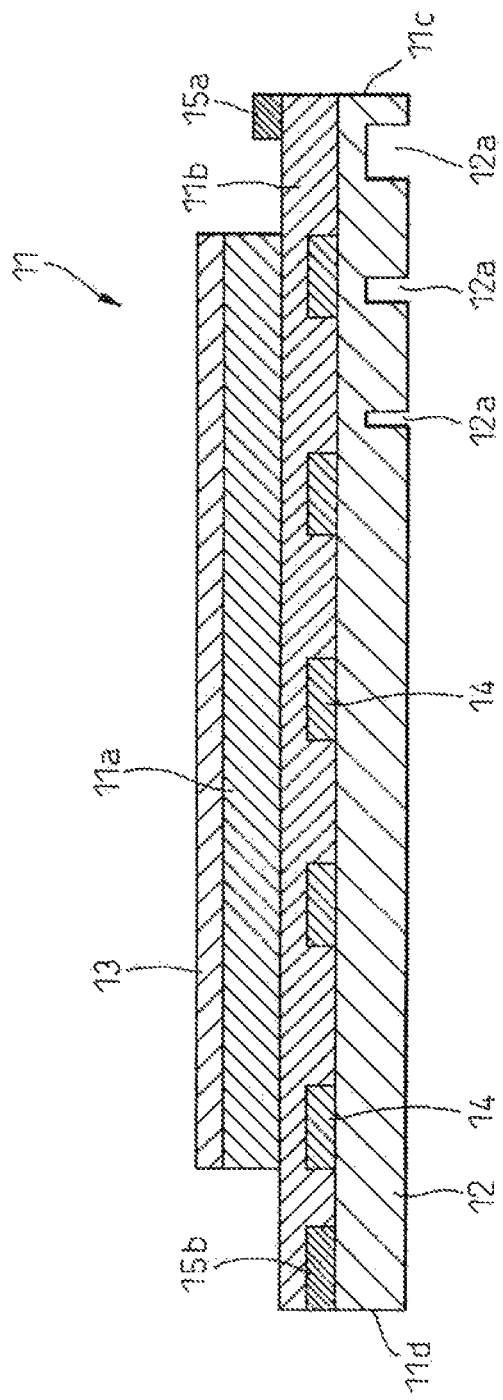
FIG. 7 is a diagram illustrating a pn stack according to a third embodiment of the power generating system disclosed in this specification.

The third embodiment of the power generating system disclosed in this specification will be described below with reference to FIG. 7. FIG. 7 is a diagram illustrating a pn stack according to the third embodiment of the power generating system disclosed in this specification.

In the present embodiment, provisions are made to increase the amount of power generation in the thermal power generation by increasing the temperature difference between the longitudinal ends of the n-type semiconductor layer 11b.

More specifically, the end electrodes 15a and 15c formed am the respective ends of the n-type semiconductor layer 11b and the slits 12a formed in the substrate 12 differ from those in the earlier described first embodiment.

That is, as depicted in FIG. 7, the end electrode 15b located at the one longitudinal end 11d of the n-type semiconductor layer 11b is larger in size than the end electrode 15a located at the other longitudinal end 11c. More specifically, the plan area of the one end electrode 15b is larger than that of the other end electrode 15a.

Since the one end electrode 15b larger in size has a higher thermal conductivity than the other end electrode 15a smaller in size, the temperature difference between the longitudinal ends of the n-type semiconductor layer 11b can be made larger. For example, even when the temperature of the substrate 12 is uniform along the longitudinal direction thereof, a temperature gradient can be set up along the longitudinal direction of the re-type semiconductor layer 11b.

Further, the one end electrode 15b is formed between the n-type semiconductor layer 11b and the substrate 12. It is preferable to use a material having good electrical conductivity, for example, a metal such as Ag or Cu, as the material for the end electrodes 15a and 15b. A material having good electrical conductivity has excellent thermal conductivity.

When the end electrode 15a having excellent thermal conductivity is disposed between the n-type semiconductor layer 11b and the substrate 12, the thermal energy transferred from, the heat source such as the ground to the substrate 12 can be efficiently conducted to the corresponding end of the n-type semiconductor layer 11b.

On the other hand, the other end electrode 15b is disposed on the surface of the n-type semiconductor layer 11b, and therefore does not have the same function as the one end electrode 15a.

In this way, the temperature difference between the longitudinal ends of the n-type semiconductor layer 11b can be further increased.

From the above standpoint, it is preferable to use a material having nigh thermal conductivity as the material for the one end electrode 15b in order to increase she temperature at the corresponding end of the n-type semiconductor layer 11b. On the other hand, it is preferable to use a material having low thermal conductivity as the material for the other end electrode 15a in order to hold the temperature of the n-type semiconductor layer 11b relatively low.

FIG. 8 is a list of the materials that can be used for the end electrodes and their thermal conductivities. As the material for the one end electrode 15b, use may be made, for example, of Ag or Cu. As the material for the other end electrode 15b, use may be made, for example, of In or Sn.

In the present embodiment, the plurality of slits 12a formed in the substrate 12 gradually become larger in width coward the other longitudinal end 11c of the pn stack 11. Stated another way, the sifts 12a gradually become smaller in width toward, the one longitudinal end 11d of the pn stack 11.

By using such slits 12a, the temperature gradient along the longitudinal direction of the substrate 12 can be increased. In the earlier described first embodiment, the slits having the same width have been formed by varying their pitch in order to increase the temperature gradient in the substrate 12, but for that purpose, a large number of slits have had to be formed in the substrate 12. By contrast, in the present embodiment which uses slits of different widths, the manufacturing cost can be reduced because the same effect as that earlier described can be obtained while reducing the number of slits to be formed in the substrate 12.

In the above example, the thermal power generation has been described for the case where power is generated in the nighttime by utilising geothermal heat as the heat source. However, the power generating apparatus 10 can also perform thermal power generation in the daytime by utilizing sunlight as the heat source. From the standpoint of performing thermal power generation in the daytime, it is preferable to use a material having low light reflectivity as the material for the one end electrode 15b in order to be able to absorb the sunlight and thereby increase the temperature at the corresponding end of the n-type semiconductor layer 11b. On the other hand, for the other end electrode 15a, it is preferable to use a material having high light reflectivity in order to be able to reflect the sunlight and thereby hold the temperature at the other end of the n-type semiconductor layer 11b relatively low. As the material having low light reflectivity, use may be made, for example, of Cu or In. As the material having high light reflectivity, use may be made, for example, of Ag or Al.

According to the pn stack of the present embodiment described above, the amount of thermal power generation can be increased by suitably selecting the size, position, thermal conductivity, or light reflectivity for the respective end electrodes so as to increase the temperature gradient formed along the longitudinal direction of the n-type semiconductor layer 11b.

The above description also applies, where appropriate, to the pn stack in which the end electrodes are formed, at both longitudinal ends of the p-type semiconductor layer 11a.

[d] Fourth Embodiment

Figure 9A:
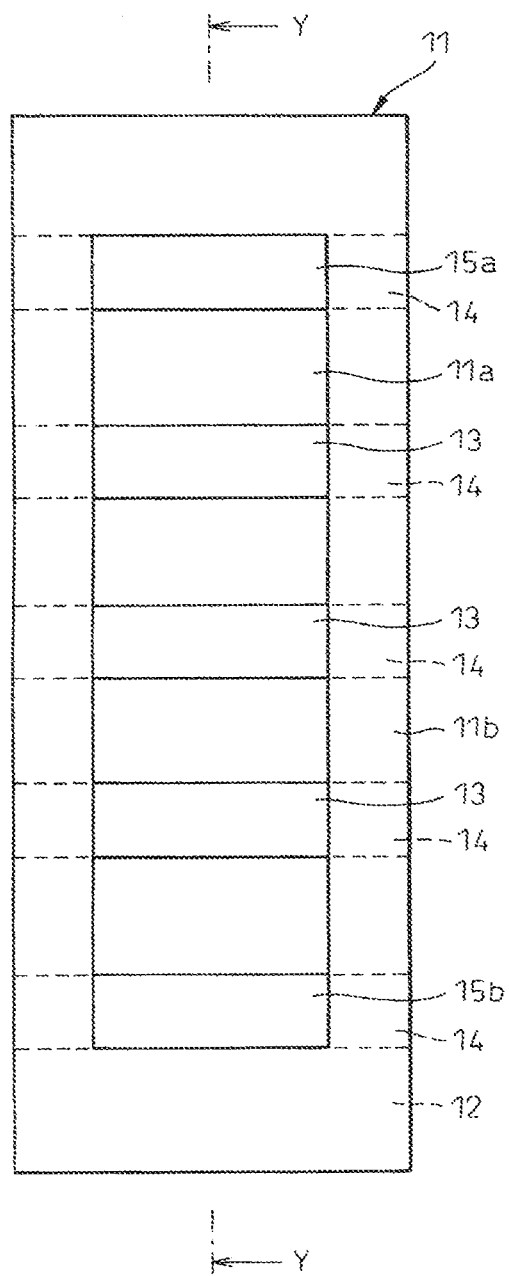
FIG. 9A is a plan view of a pn stack according to a fourth embodiment of the power generating system disclosed in this specification.
Figure 9B:
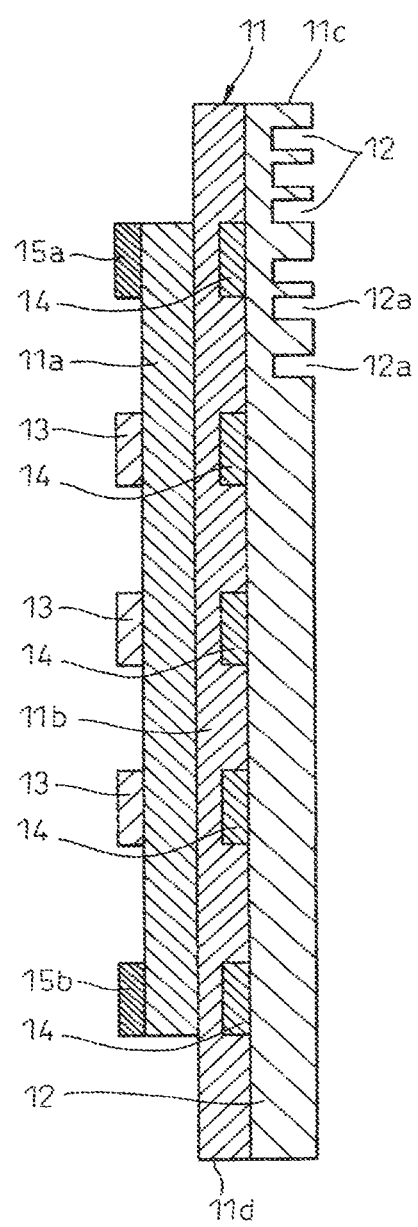
FIG. 9B is a cross-sectional view taken along line Y-Y in FIG. 9A.

The fourth embodiment of the power generating system disclosed in this specification will be described below with reference to FIG. 9. FIG. 9h is a plan view of a pn stack according to the fourth embodiment of the power generating system disclosed in this specification, and FIG. 3B is a cross-sectional view taken along line Y-Y in FIG. 9A.

The power generating system, of this embodiment differs from the earlier described first embodiment in that the top electrode 13 is not formed as a blanket electrode but formed in a comb-like electrode structure. That is, a plurality of top electrodes 13 are arranged on the p-type semiconductor layer 11a in such a manner as to be spaced apart from one another in the longitudinal direction of the p-type semiconductor layer 11a.

In the present embodiment, the top electrodes 13 are formed at the same positions as the bottom electrodes 1A as viewed along the longitudinal direction of the pn stack 11.

However, the end electrodes 15a and 15b are formed at both longitudinal ends of the p-type semiconductor layer 11a. In the thermal power generation mode, the end electrodes 15a and 15b on the p-type semiconductor layer 11a are connected to the corresponding end electrodes on the n-type semiconductor layers 11b in its adjacent pn stacks 11.

In the photovoltaic power generation mode, from the standpoint of suppressing the recombination of minority carries at the interface with the electrodes, it is preferable to minimize the area where the electrodes contact the semiconductor layer. In view of this, the present embodiment uses comb-like electrodes as the too electrodes 13.

When using the comb-like electrodes on the light incident side as described, it is preferable to reduce the width of each electrode and increase the spacing between, the respective electrodes so as not to interfere with the light entering the semiconductor layer.

According to the power generating system of the present embodiment described above, since the recombination of minority carries can be suppressed because of the use of comb-like electrodes as the top electrodes 13, the efficiency of power generation in the photovoltaic power generation mode can be enhance.

[e] Fifth Embodiment

Figure 10:
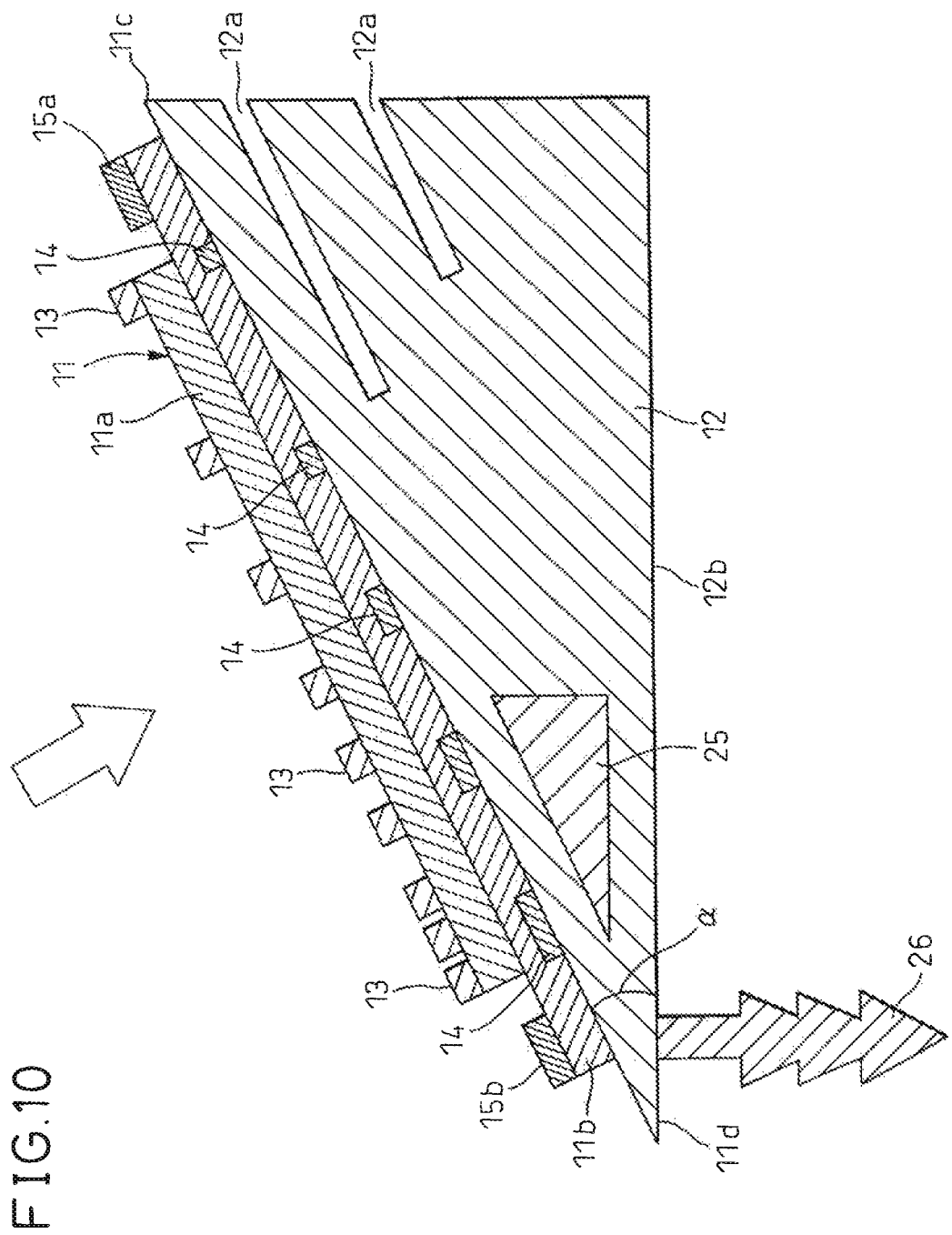
FIG. 10 is a cross-sectional view of a pn stack according to a fifth embodiment of the power generating system disclosed in this specification.

The fifth embodiment of the power generating system disclosed in this specification will be described below with reference to FIG. 10. FIG. 10 is a cross-sectional view of a pn stack according to the fifth embodiment of the power generating system disclosed in this specification.

The top face of the substrate 12, on which the p-type semiconductor layer 11a and the n-type semiconductor layer 11b are formed, is inclined at an angle α with respect to its bottom face 12b which is parallel to the ground.

Preferably, the angle α is determined, based on the latitude and altitude at which the power generating system 1 equipped with the power generating apparatus 10 is installed, so as to ensure that the p-type semiconductor layer 11a can be efficiently exposed to the sunlight. For example, the angle α may be determined so that the light from the sun will be incident perpendicular to the semiconductor or layer at noon on the spring or autumnal equinox day.

As depicted in FIG. 10, the thickness of the substrate 12 gradually decreases toward the one longitudinal end 11d of the pn stack 11, thus forming the angle α. Conversely, the thickness of the substrate 12 gradually increases toward, the other longitudinal end 11c of the pn stack 11.

At the one longitudinal end 11d of the pn stack 11, geothermal heat is easily conducted to the n-type semiconductor layer 11b because of the reduced thickness of the substrate 12. On the other hand, at the other longitudinal end 11c of the pn stack 11, geothermal heat is difficult to conduct to the n-type semiconductor layer 11b because of the increased thickness of the substrate 12.

It is preferable to use a material having low thermal conductivity as the material for the substrate 12 from the standpoint of increasing the temperature difference between the longitudinal ends of the n-type semiconductor layer 11b. As the material for the substrate 12, use may be made, for example, of glass or plastic.

A heat storage medium 25 is embedded inside the substrate 12 in the position near the one longitudinal end of the pn stack 11 where the thickness of the substrate is reduced. The heat storage medium 25 stores heat by receiving radiation from the sun in the daytime, and releases the stored heat in the nighttime to increase the temperature in the portion of the n-type semiconductor layer 11b that is located near the one longitudinal end 11d. This serves to enhance the efficiency of power generation in the nighttime thermal, power generation mode.

Further, the one longitudinal end 11d of the pn stack 11 is thermally connected to a thermally conductive stake 26 driven into the ground so that the heat from the ground can be easily conducted to the longitudinal end 11d. It is preferable to use a material having good thermal conductivity as the material for the stake 26. For example, copper may be as the material for the stake 26.

On the other hand, the other longitudinal end of the pn stack 11 where the thickness of the substrate is increased is provided with a plurality of slits 12a to prevent the conduction of geo-thermal heat to the n-type semiconductor layer 11b.

Further, in the present embodiment, the bottom electrodes 14 gradually become larger in width toward the one longitudinal end 11d so that the geothermal heat transferred to the substrate 12 can be easily conducted to the one longitudinal end 11d of the n-type semiconductor layer 11b through the bottom, electrodes 14.

Conversely, the bottom electrodes 14 gradually become smaller in width toward the other longitudinal end 11c to make it difficult for the geothermal heat to conduct from the substrate 12 to the other longitudinal end 11c of the n-type semiconductor layer 11b through the bottom electrodes 14.

In the present embodiment, the top electrodes 13 are constructed from comb-like electrodes, and the pitch of the top electrodes 13 gradually becomes smaller toward the one longitudinal end 11d. Stated another way, the pitch of the top electrodes 13 gradually becomes larger toward the other longitudinal end 11c.

According to the power generating system of the present embodiment described above, the efficiency not only of photovoltaic power generation, but also of thermal power generation is enhanced.

[f] Sixth Embodiment

Figure 11:
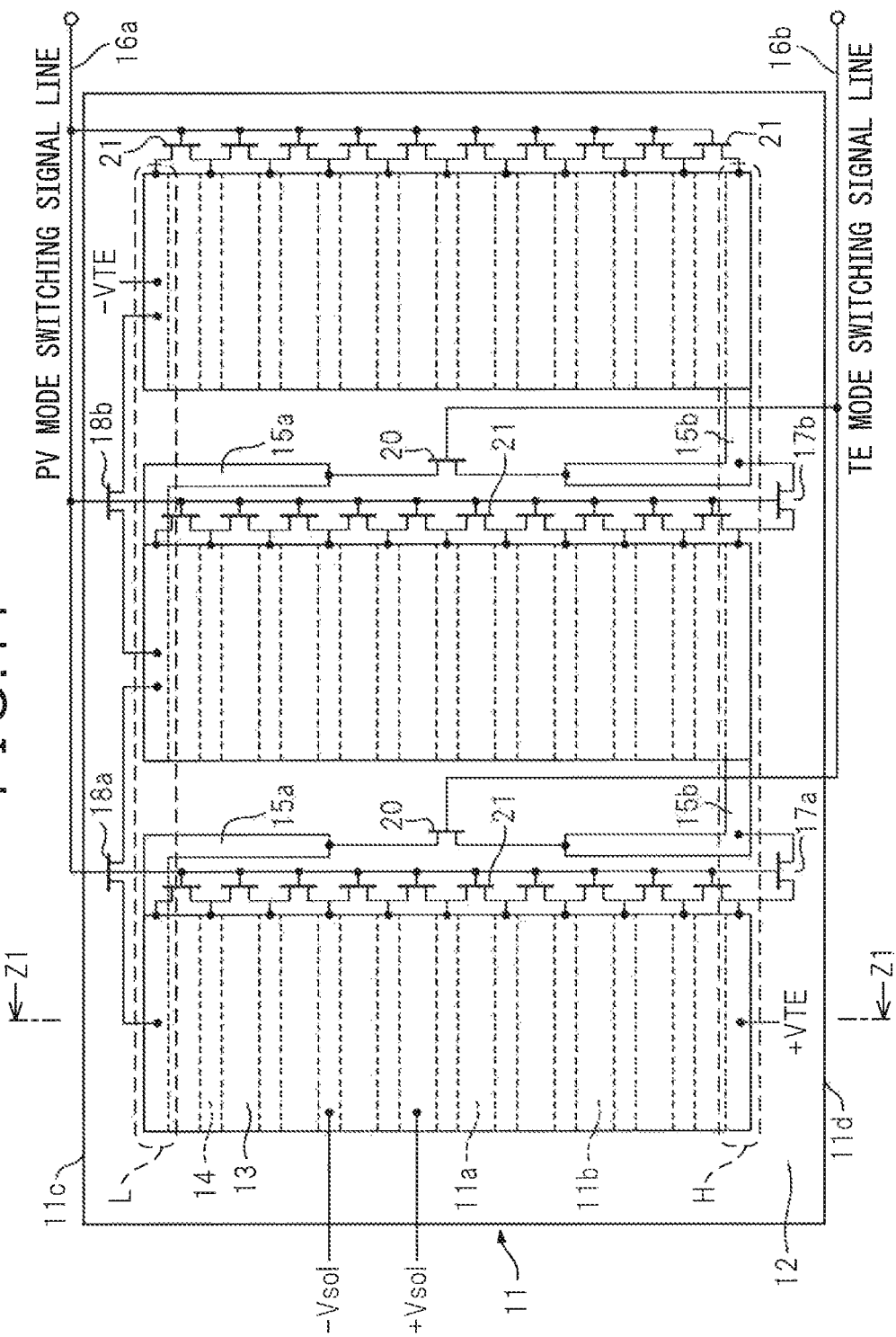
FIG. 11 is a plan view of a pn stack array according to a sixth embodiment of the power generating system disclosed in this specification.
Figure 12:
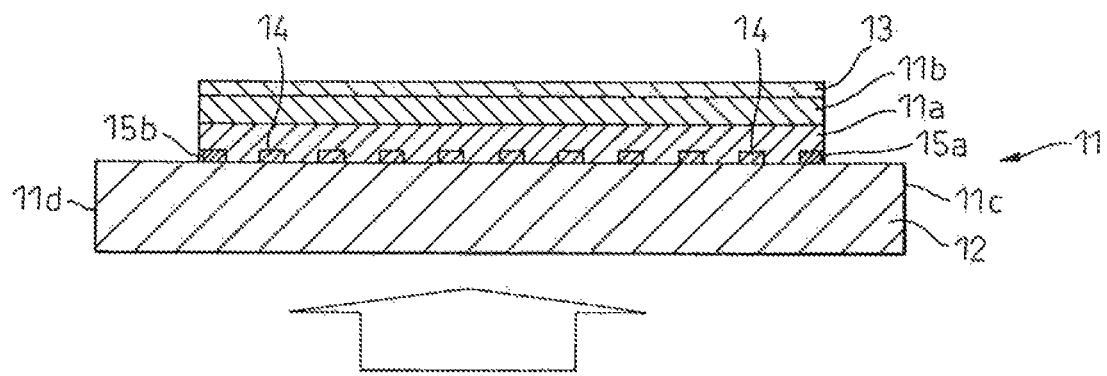
FIG. 12 is a cross-sectional view taken along line Z1-Z1 of the pn stack array in FIG. 11.

The sixth embodiment of the power generating system, disclosed in this specification will be described below with, reference to FIGS. 11 and 12. FIG. 11 is a plan view of a pn stack array according to the sixth embodiment of the power generating system disclosed in this specification. FIG. 12 is a cross-sectional view taken along line Z1-Z1 of the pn stack array in FIG. 11.

The pn stack array 11 of this embodiment includes a substrate 12 transparent to sunlight. Here, the sunlight enters the pn stack array 11 from the substrate 12 side, as depicted in FIG. 12.

A plurality of p-type semiconductor layers 11a are arranged on the same substrate 12. An n-type semiconductor layer 11b is formed on top of each p-type semiconductor layer 11a.

Comb-like electrodes as bottom electrodes 14 are formed between the substrate 12 and the p-type semiconductor layer 11a. On the other hand, a blanket electrode as a top electrode 13 is formed on the n-type semiconductor layer 11b.

As depicted in FIGS. 11 and 12, end electrodes 15a and 15b are formed at both longitudinal ends of the p-type semiconductor layer 11a in such a manner as to be sandwiched between the p-type semiconductor layer 11a and the substrate 12.

As depicted in FIG. 11, the end electrode 15a extends toward the end electrode 15b in the adjacent pn stack 11.

In the present embodiment, the mode switching unit 16 includes fourth switching devices 20 each for connecting between the opposing end electrodes 15a and 15b. The fourth switching devices 20 are connected to the TE mode switching signal line 16b, and conduct when a signal is applied from the TE mode switching signal line 16b. The TE mode switching signal line 16b is connected to the mode switching unit 16.

In the thermal power generation mode, the mode switching unit 16 connects the p-type semiconductor layers 11a in series with each other between the plurality of on stacks 11. Then, in each pn stack 11, a temperature difference is set up between the high temperature region H located at the one longitudinal end 11d and the low temperature region L located at the other longitudinal end 11c. In this way, thermal power generation can be performed by using only the p-type semiconductor layers 11a. The power thus generated is output from the output terminals +VTE and −VTE.

As in the first embodiment, in the photovoltaic power generation mode, the mode switching unit 16 outputs a signal on the PV mode switching signal line 16a, causing the first switching devices 17a and 17b, the second switching devices 18a and 18b, and the fifth switching devices 21 to conduct. Thus, the p-type semiconductor layers 11a and the n-type semiconductor layers 11b are respectively connected in parallel.

Preferably, the p-type semiconductor layer 11a and the n-type semiconductor layer 11b are formed using organic semiconductor materials. Such organic semiconductor materials include, for example, organic compounds such as organic dyes, organic polymers, etc. or carbon nanotubes.

More specifically, as the material for the p-type semiconductor layer 11a, rise may be made, for example, of 3-hexylthiophene (P3HT). On the other hand, as the material for the n-type semiconductor layer 11b, use may be made, for example, of a fullerene derivative Preferably, the substrate 12 is formed using an electrically insulating material transparent to sunlight. For example, the substrate 12 may be formed from glass.

Further, a buffer layer may be formed between the substrate 12 and the p-type semiconductor layer 11a and also between the n-type semiconductor layer 11b and the top electrode 13. As the material for the buffer layer, use may be made, for example, of $TiO_2$, $MoO_3$, PEDOT-PSS, or BCP (bathocuproine).

According to the present, embodiment described above, because of the provision of the transparent substrate 12 through which sunlight is made to enter, neither the top electrode 13 nor the semiconductor layers are directly exposed to the outside air; this serves to improve the durability of the pn stack 11.

In the present embodiment, the mode switching unit 16 may effect switching to the thermal power generation mode by operating the fourth switching devices 20 to connect the n-type semiconductor layers 11b in series with each other between the plurality of pn stacks 11. Further, a transparent film may be used as the substrate 12. Furthermore, the top electrode 13 may be formed as a transparent electrode so that the light can be made to enter from above or through both the top and bottom faces.

[g] Seventh Embodiment

Figure 13:
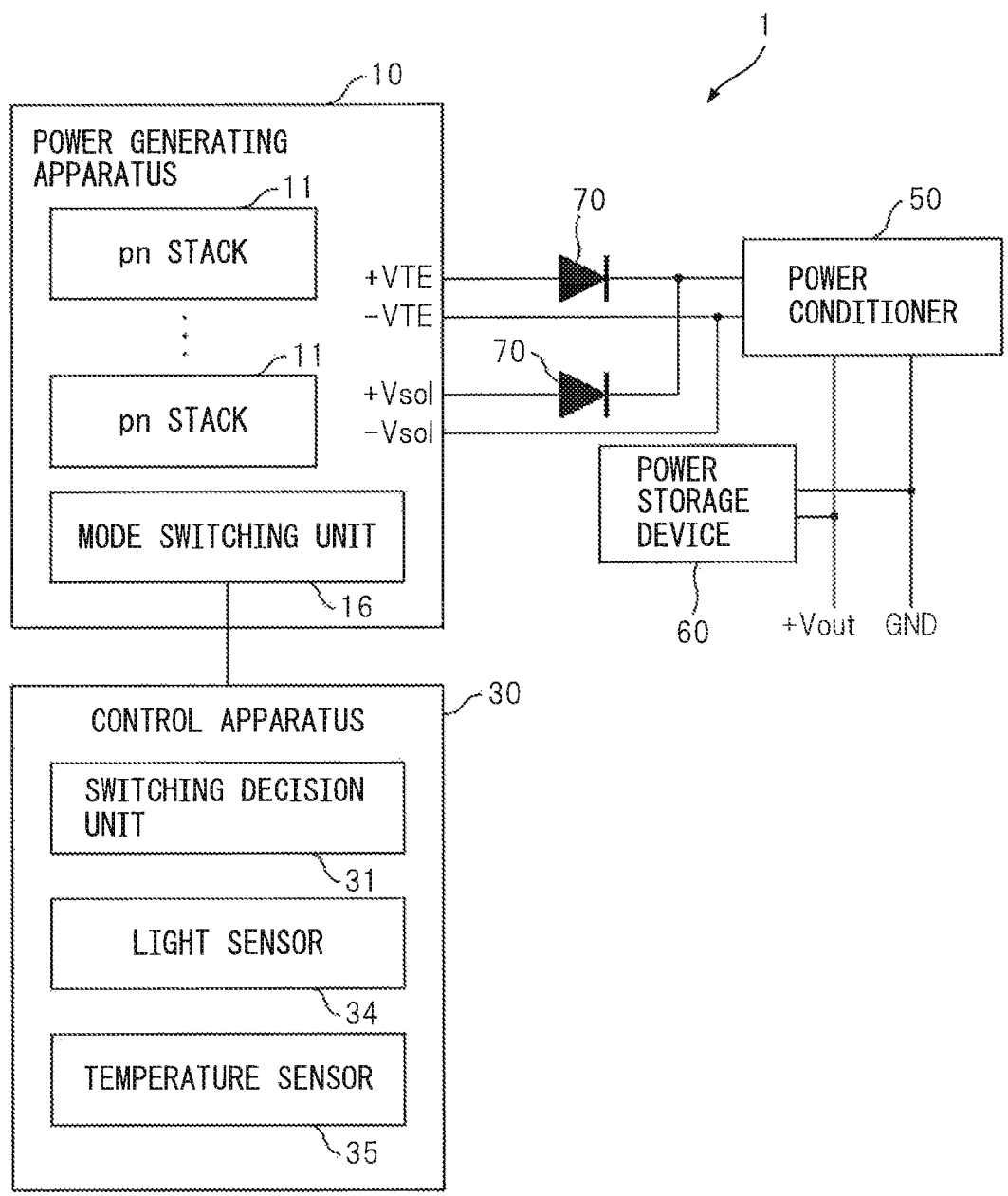
FIG. 13 is a system configuration diagram of a seventh embodiment of the power generating system disclosed in this specification.

The seventh embodiment of the power generating system disclosed in this specification will be described below with reference to FIG. 13. FIG. 13 is a system, configuration diagram of the seventh embodiment of the power generating system disclosed in this specification.

In the present embodiment, the control apparatus 30 includes a switching decision unit 31, a light sensor 34, and a temperature sensor 35. The switching decision unit 31 instructs the mode switching unit. 16 to effect mode switching, based on the outputs of the light sensor 34 and the temperature sensor 35.

The switching decision unit 31 takes as inputs the outputs of the light sensor 34 and the temperature sensor 35, and selects the photovoltaic power generation mode or the thermal power generation mode, whichever is capable of generating a larger amount of power. Then, the switching decision unit 31 instructs the mode switching unit 16 to effect switching to the selected mode.

According to the present embodiment described above, the efficiency of power generation can be further enhanced by selecting the optimum power generation mode based on the current weather conditions such as the available amount of sunlight, temperature, etc.

Further, as a modified example of the seventh embodiment, the pn stack 11 in the power generating apparatus 10 may be used as the light sensor. Then, power may be generated by selecting the photovoltaic power generation mode when the voltage generated by the pn stack 11 acting as the light sensor is equal to or higher than a predetermined threshold value, and the thermal power generation node when the voltage is lower than the predetermined threshold value.

[h] Eight Embodiment

Figure 14:
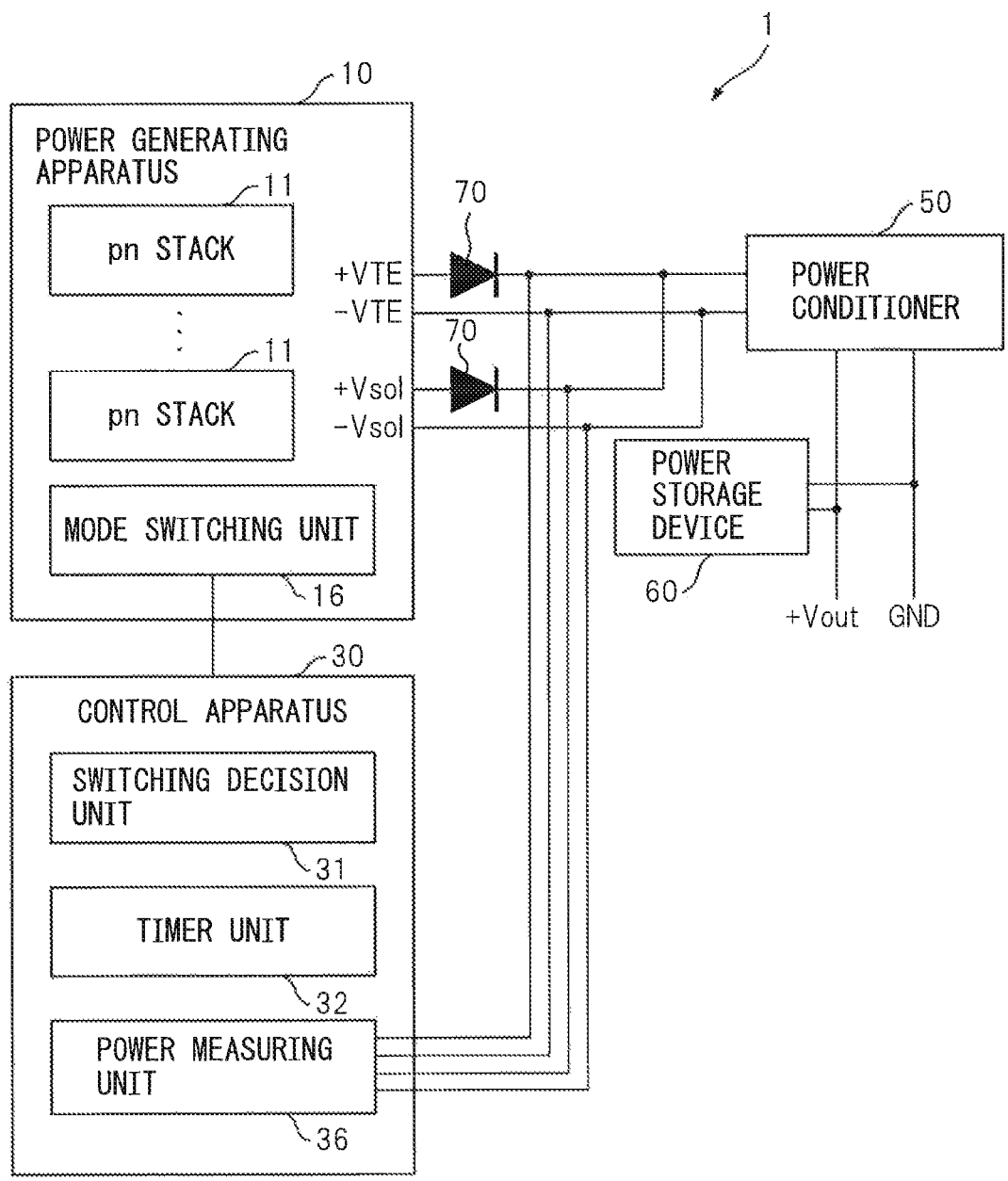
FIG. 14 is a system configuration diagram of an eighth embodiment of the power generating system disclosed in this specification.
Figure 15:
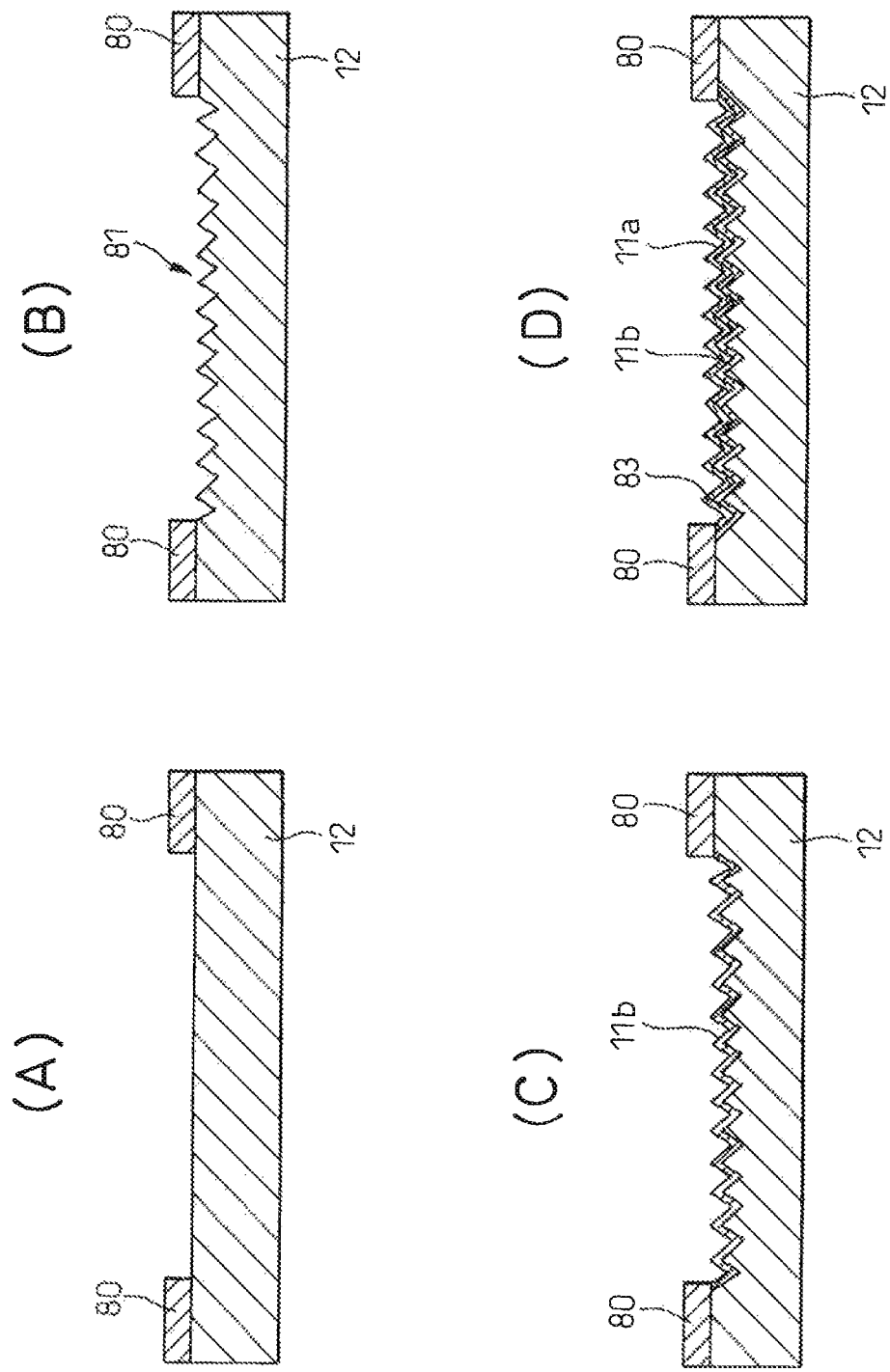
FIG. 15 is a diagram (part 1) illustrating a fabrication process according to a first embodiment of a fabrication method, for the power generating apparatus disclosed in this specification.
Figure 16:
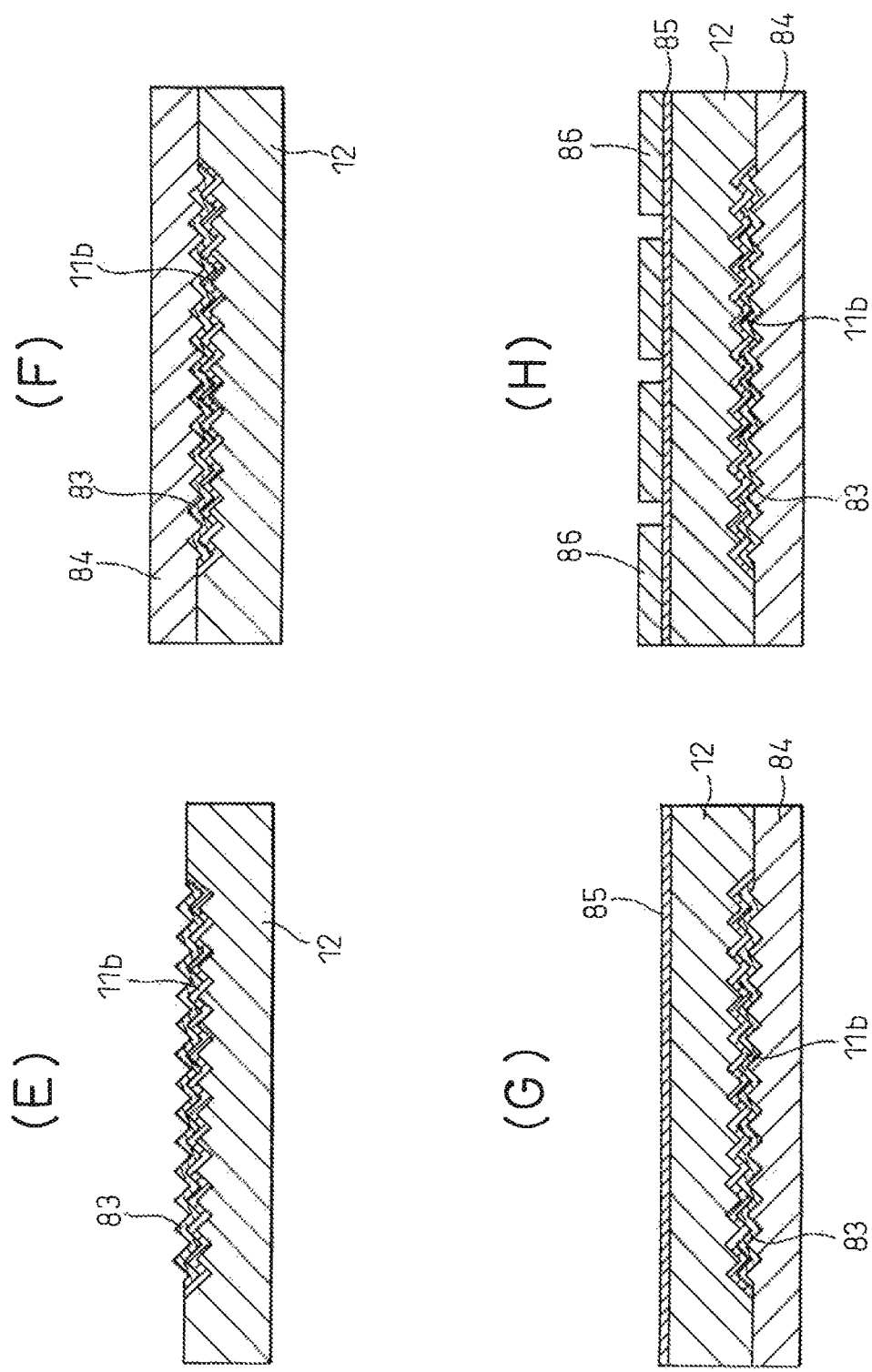
FIG. 16 is a diagram (part 2) illustrating a fabrication process according to the first embodiment of the fabrication method for the power generating apparatus disclosed in this specification.
Figure 17:
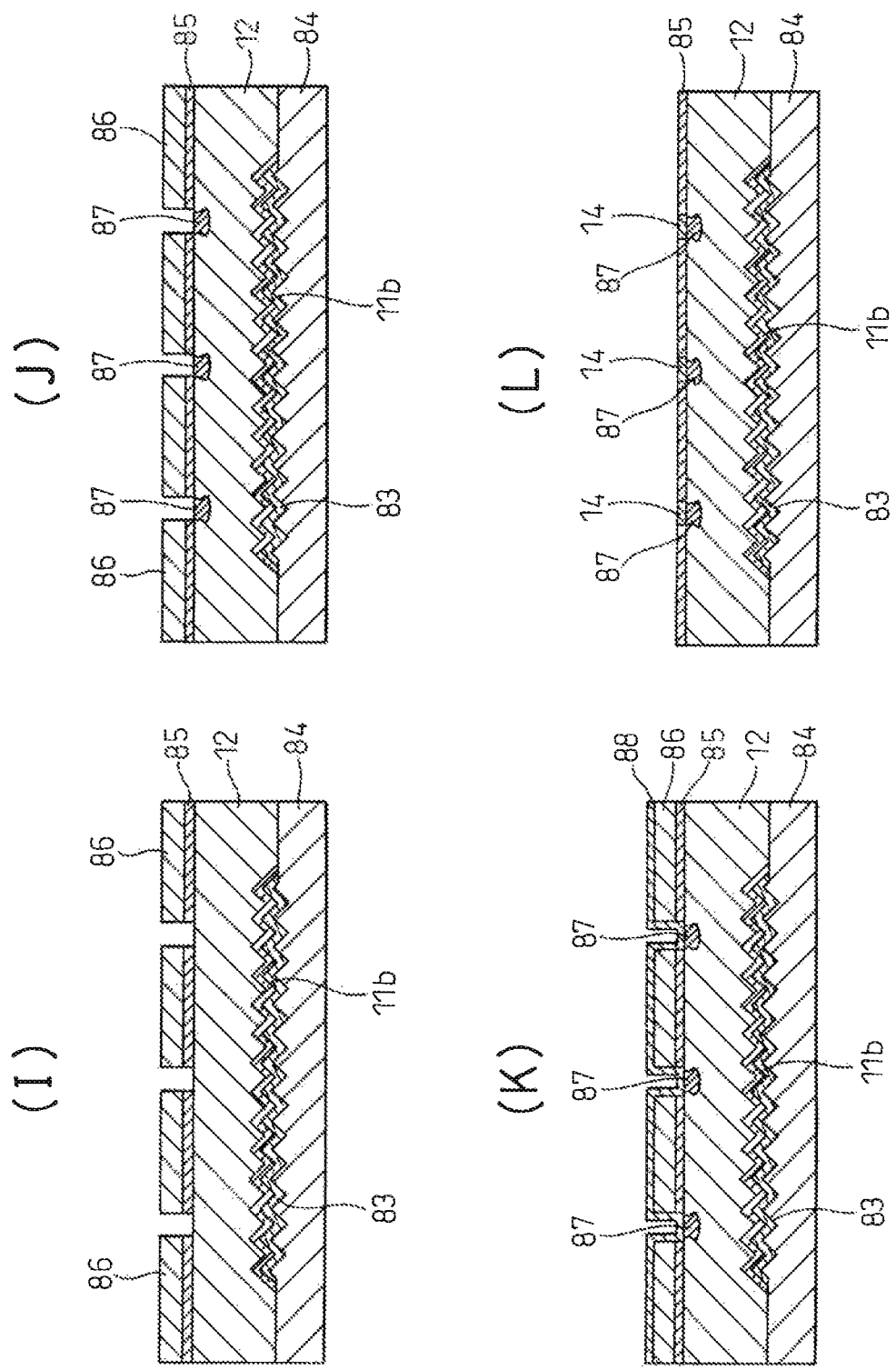
FIG. 17 is a diagram (part 3) illustrating a fabrication process according to the first embodiment of the fabrication method for the power generating apparatus disclosed in this specification.
Figure 18:
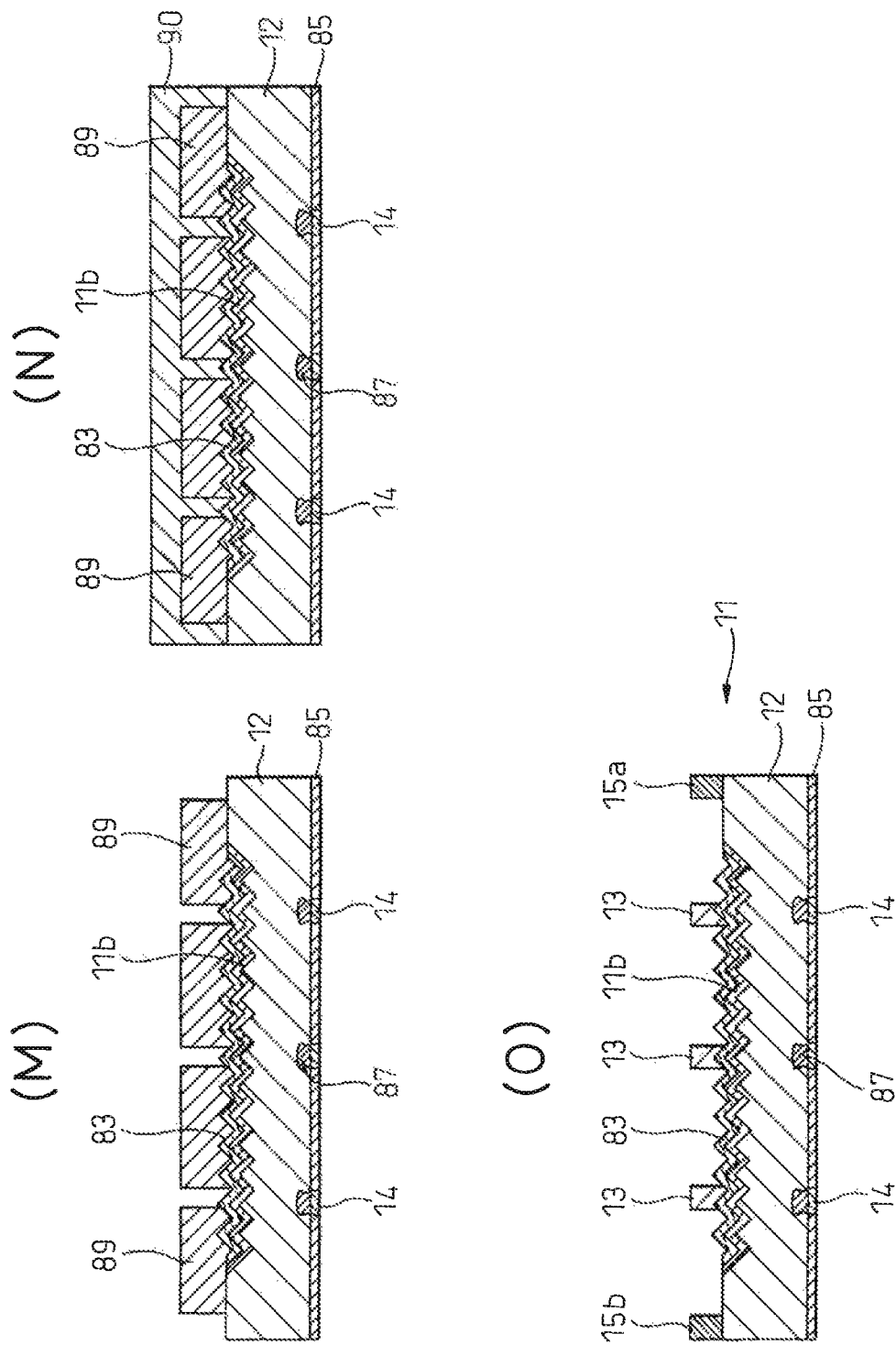
FIG. 18 is a diagram (part 4) illustrating a fabrication process according to the first embodiment of the fabrication method for the power generating apparatus disclosed in this specification.
Figure 19:
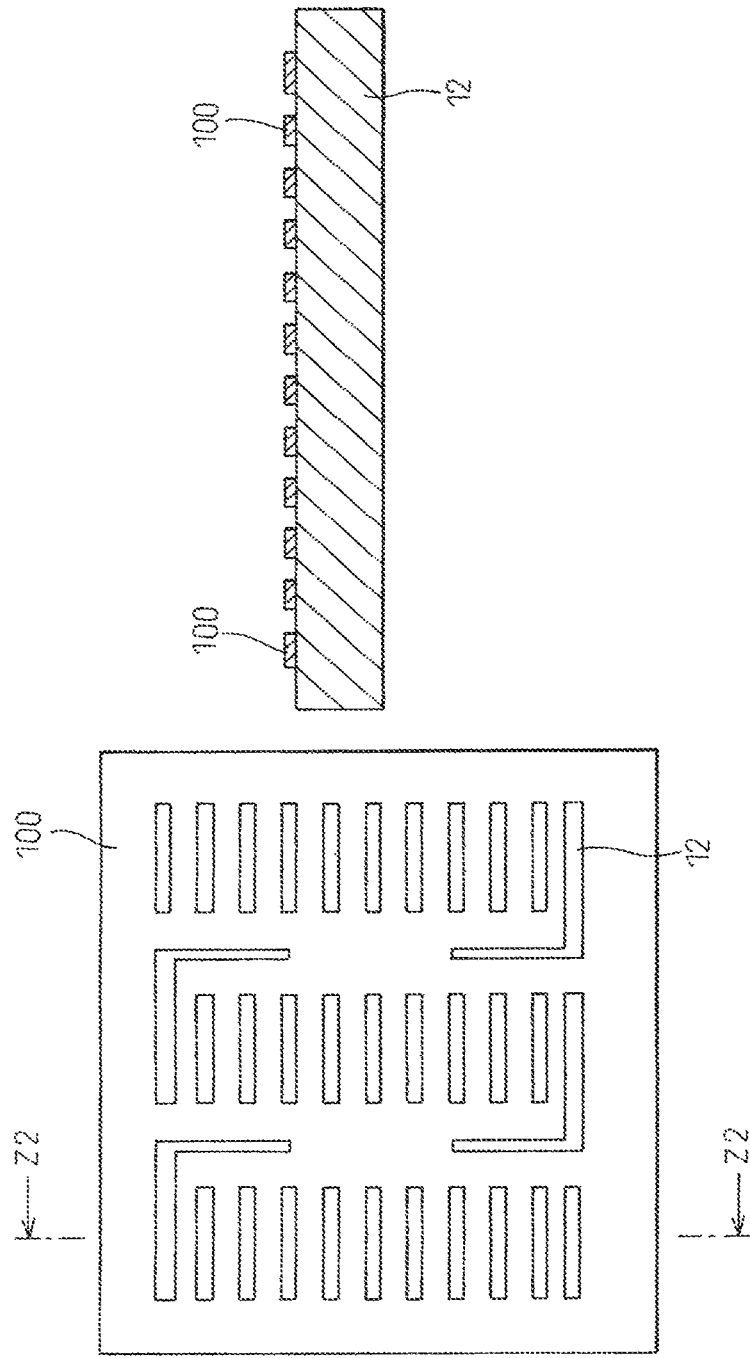
FIG. 19 is a diagram (part 1) illustrating a fabrication process according to a second embodiment of the fabrication method for the power generating apparatus disclosed in this specification.

The eighth embodiment of the power generating system disclosed in this specification will be described below with reference to FIG. 14. FIG. 14 is a system configuration diagram of the eighth embodiment of the power generating system disclosed in this specification.

The control apparatus 30 in this embodiment includes a switching decision unit 31, a timer unit 32, and a power measuring unit 36 which measures generated power in the photovoltaic power generation mode as well as in the thermal power generation mode.

The power output at +Vsol and −Vsol in the photovoltaic power generation mode is coupled to the power measuring unit 36. Further, the power output at +VTE and −VTE in the thermal power generation mode is coupled to the power measuring unit 36.

The timer unit 32 outputs a signal to the switching decision unit 31 to effect switching between the photovoltaic power generation mode and the thermal power generation mode at every predetermined interval of time. The predetermined interval of time may, for example, be in the range of 10 to 30 minutes.

When, the signal from the tinier unit 32 is received, the switching decision unit 31 instructs the mode switching unit 16 to switch the mode so that power is generated, for a predetermined period of time in each of the photovoltaic power generation and thermal power generation modes.

The power generating apparatus 10 generates power for the predetermined period of time in each of the photovoltaic power generation and thermal power generation modes under the control of the mode switching unit 16.

The power measuring unit 36 measures the power generated in the photovoltaic power generation node and the power generated in the thermal power generation mode, and supplies the measured values to the switching decision unit 31.

The switching decision unit 31 supplied with the measured values of the generated power compares the amount of power generated in the photovoltaic power generation mode with the amount of power generated in the thermal power generation mode, and instructs the mode switching unit 16 to switch the power generation mode to the mode that generated the larger amount of power.

According to the present embodiment described above, power can be generated efficiently by selecting the optimum power generation mode at every predetermined interval, of time, based on the current weather conditions such, as the available amount of sunlight, temperature, etc.

Next, a first preferred embodiment of a method for fabricating the pn stack in the power generating apparatus of the power generating system described above will be described below with reference to FIGS. 15 to 18.

First, as depicted in FIG. 15(A), a mask pattern 80 is formed on a p-type Si substrate 12. The substrate 13 may be a single-crystalline substrate or a polycrystalline substrate. The p-type Si substrate 12 also serves as a p-type semiconductor layer.

Next, as depicted in FIG. 15(B), the substrate 12 is anisotropically etched by immersing it in an alkaline solution. The result is the formation of a textural structure 81 on the surface of the substrate 12 where it is not covered with the mask pattern 80. With the provision of the textural structure 81, the sunlight can be absorbed efficiently, and hence a greater photon energy for excitation. As the alkaline solution, use may be made, for example, of a KOH or NaOH solution.

Next, as depicted in FIG. 15(C), an n-type semiconductor layer 11b is formed on the surface of the substrate 12 by thermally diffusing impurities, such as P, into the region not covered with the mask pattern 80.

Then, as depicted in FIG. 15(D), an antireflective layer 83 is formed on the n-type semiconductor layer 11b. The antireflective layer 83 can be formed by CVD (Chemical Vapor Deposition) or by sputtering. As the material or forming the antireflective layer 83, use may be made, for example of SiN.

Next, the mask pattern 80 is removed as depicted in FIG. 16(E).

Thereafter, a mask layer 84 is formed on the antireflective layer 83, as depicted in FIG. 16(F).

Next, as depicted in FIG. 16(G), an insulating layer 85 is formed on the surface of the substrate 12 opposite from, the surface thereof on which the n-type semiconductor layer 11b is formed. The insulating layer 85 can be formed by CVD (Chemical Vapor Deposition) or by sputtering. As the material for forming the insulating layer 85, use may be made, for example, of $SiO_2$.

Next, as depicted in FIG. 16(H), a mask pattern 86 for forming bottom electrodes in a comb-like structure is formed on the insulating layer 85.

Next, as depicted in FIG. 17(I), the portions of the insulating layer 85 that are exposed through the mask pattern 86 are removed by etching. The etching can be accomplished by wet etching using hydrofluoric acid or by dry etching.

Then, as depicted in FIG. 17(J), impurity diffusion layers 87 as p+ regions are formed by thermally diffusing boron or the like into the portions of the substrate 12 that are exposed through the mask pattern 86.

Next, as depicted in FIG. 17(K), a conductor layer 88 is formed so as to cover the impurity diffusion layers 87 as well as the mask pattern 86. The conductor layer 88 can be formed by spattering or by evaporation. As the material for terming the conductor layer 88, use may be made, for example, of a metal such as Al or Au.

Subsequently, the conductor layer 88 is removed together with the mask pattern 86, leaving only the desired portions of the conductor layer 88, as depicted in FIG. 17(L). The thus left portions of the conductor layer 88 form the bottom electrodes 14.

Next, as depicted in FIG. 18(M), the mask layer 84 is patterned to form a mask pattern 89. The mask pattern 89 has openings each aligned with the position of the corresponding bottom electrode 14.

Next, as depicted in FIG. 18(N), a conductor layer 90 is formed on the substrate 12. The conductor layer 90 can be formed by sputtering or by evaporation. As the material for forming the conductor layer 90, use may be made, for example, of a metal such as Al or Au.

Subsequently, the conductor layer 90 is removed by liftoff together with the mask pattern 89, as depicted in FIG. 18(O), leaving only the desired portions of the conductor layer 90 and thus forming the top electrodes 13 and end electrodes 15a and 15b.

The pn stack 11 is thus fabricated by the first embodiment of the fabrication method described above.

In the above process, the n-type semiconductor layer 11b may be formed on the substrate 12. In this case, an n-type Si substrate coped with n-type impurities such as F is used as the substrate 12. Further, impurity diffusion layers as n+ regions are formed by thermally diffusing n-type impurities such as P.

Since prior known solar cell fabrication methods can be used as needed in the pn stack fabrication method of the present embodiment described above, the pn stack can be easily fabricated.

Next, a second preferred embodiment of a method for fabricating the pn stack in the power generating apparatus of the power generating system described above will be described below with reference to FIGS. 19 to 24. The pn stack in the earlier described, sixth embodiment, for example, is fabricated using the method of the embodiment described hereinafter.

First, as depicted in FIGS. 19(A) and 19(B), a mask pattern 100 for forming bottom electrodes and end electrodes is formed, on a glass substrate 12.

Figure 20:
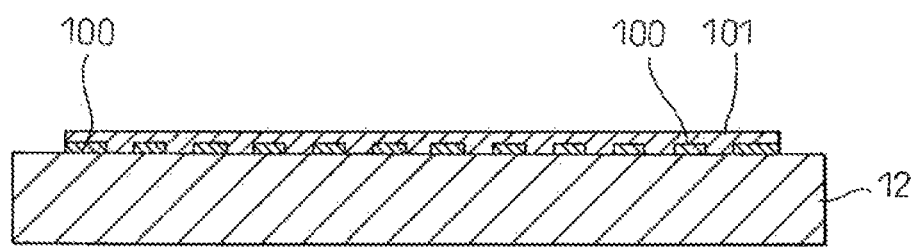
FIG. 20 is a diagram (part 2) illustrating a fabrication process according to the second embodiment of the fabrication method for the power generating apparatus disclosed in this specification.

Next, as depleted in FIG. 20, an electrically conductive layer 101 is formed on the glass substrate 12. The electrically conductive layer 101 can be formed, for example, by sputtering. As the material for forming the electrically conductive layer 101, use may be made, for example, of ITO or ZnO.

Figure 21:
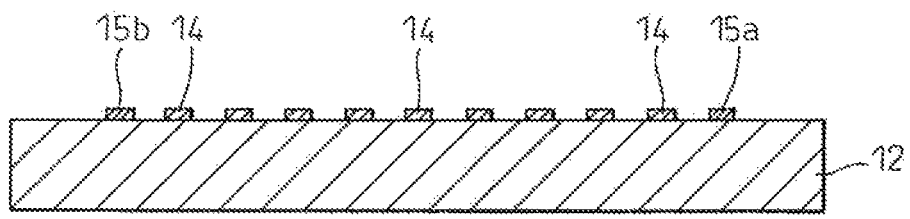
FIG. 21 is a diagram (part 3) illustrating a fabrication process according to the second embodiment of the fabrication method for the power generating apparatus disclosed in this specification.

Then, the electrically conductive layer 101 is removed by liftoff together with the mask pattern 100, as depicted in FIG. 21, leaving only the desired portions of the electrically conductive layer 101 and thus forming the bottom electrodes 14 and end electrodes 15a and 15b.

Next, as depicted in FIGS. 22(A) and 22(B), a mask pattern 102 is formed on the substrate 12.

Figure 23:
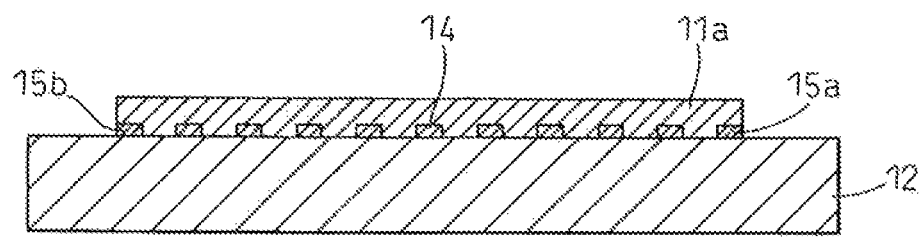
FIG. 23 is a diagram, (part 5) illustrating a fabrication process according to the second embodiment of the fabrication method for the power generating apparatus disclosed in this specification.

Next, after forming a p-type semiconductor layer, for example, by spin coating on the substrate 12, the mask pattern 102 is removed, forming the p-type semiconductor layer 11a on the substrate 12 as depicted in FIG. 23. As the material, for forming the p-type semiconductor layer 11a, use may be made, for example, of an electrically conductive polymer such as 3-hexylthiophene (P3HT). Further, a buffer layer may be provided in order to enhance the mobility of carriers between the p-type semiconductor layer 11a and the bottom electrodes 14. As the material for the buffer layer, use may be made, for example, of $TiO_2$, $MoO_3$, or PEDOT-PSS.

Figure 24:
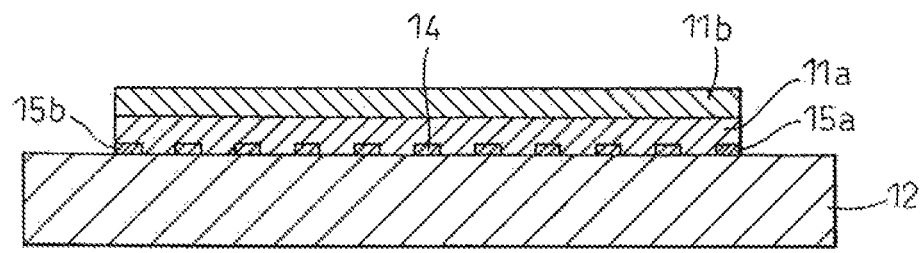
FIG. 24 is a diagram (part 6) illustrating a fabrication process according to the second embodiment of the fabrication method for the power generating apparatus disclosed in this specification.

Subsequently, as depicted in FIG. 24, an n-type semiconductor layer 11b is formed on the p-type semiconductor layer 11a by using a mask pattern (not depicted). The n-type semiconductor layer 11b can be formed, for example, by evaporation. As the material for forming the n-type semiconductor layer 11b, use may be made, for example, of PCBM which is a fullerene derivative. A mask pattern of the same size as the mask pattern 102 can be used as the mask pattern here.

Next, the top electrode 13 is formed on the n-type semiconductor layer 11b, as earlier depicted in FIG. 12. As the material for forming the top electrode 13, use may be made, for example, of Al, Ag, or Au. The top electrode 13 can be formed, for example, by evaporation. Further, a buffer layer may be provided in order to enhance the mobility of carriers between the re-type semiconductor layer 11b and the top electrode 13. As the buffer layer, use may be made, for example, of a BCP film (bathocuproine).

In the present invention, the power generating system and power generating apparatus according to each of the above embodiments can be modified in various ways without departing from the spirit and scope of the invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority and inferiority of the invention. Although the embodiments of the present invention have been described in detail, it should be understood that the various changes, substitutions, and alterations could be made hereto without departing from the spirit and scope of the invention.

The invention claimed is:

1. A power generating apparatus comprising:
a plurality of pn stacks, each formed by stacking a p-type semiconductor layer and an n-type semiconductor layer one on top of the other, having a longitudinal direction and a transverse direction which are perpendicular to a stacked direction of the p-type semiconductor layer and n-type semiconductor layer and having a first side and a second side;
a mode switching unit which affects mode switching between a photovoltaic power generation mode and a thermoelectric generation mode by changing the connections among the plurality of pn stacks in a selected configuration;
a first output terminal arranged on a side of the p-type semiconductor layer which forms the first side;
a second output terminal arranged on a side of the n-type semiconductor layer which forms the second side;
a third output terminal arranged at a first end in the longitudinal direction of the p-type semiconductor layer or the n-type semiconductor layer; and
a fourth output terminal arranged at a second end in the longitudinal direction of the p-type semiconductor layer or the n-type semiconductor layer, wherein
the mode switching unit affects mode switching to the thermoelectric generation mode by connecting the p-type semiconductor layer and the n-type semiconductor layer in series between adjacent ones of the pn stacks,
the first output terminal and second output terminal output the power generated in the photovoltaic power generation mode and the third output terminal and fourth output terminal output the power generated in the thermoelectric generation mode.

2. The power generating apparatus as claimed in claim 1, wherein the mode switching unit affects mode switching to the photovoltaic power generation mode by connecting the p-type semiconductor layers in parallel with each other and the n-type semiconductor layers in parallel with each other between the plurality of pn stacks.

3. The power generating apparatus as claimed in claim 2, wherein the mode switching unit includes
a first switching device for connecting the p-type semiconductor layers in parallel with each other,
a second switching device for connecting the n-type semiconductor layers in parallel with each other, and
a third switching device for connecting the p-type semiconductor layer and the n-type semiconductor layer in series between different ones of the pn stacks.

4. A power generating system comprising:
a power generating apparatus including,
a plurality of pn stacks, each formed by stacking a p-type semiconductor layer and an n-type semiconductor layer one on top of the other, having a longitudinal direction and a transverse direction which are perpendicular to a stacking direction of the p-type semiconductor layer and n-type semiconductor layer and having a first side and a second side;
a mode switching unit which affects mode switching between a photovoltaic power generation mode and a thermoelectric generation mode by changing the connections among the plurality of pn stacks in a selected configuration;
a first output terminal arranged on a side of the p-type semiconductor layer which forms the first side;
a second output terminal arranged on a side of the n-type semiconductor layer which forms the second side;
a third output terminal arranged at a first end in the longitudinal direction of the p-type semiconductor layer or the n-type semiconductor layer; and
a fourth output terminal arranged at a second end in the longitudinal direction of the p-type semiconductor layer or the n-type semiconductor layer, wherein
the first output terminal and second output terminal output the power generated in the photovoltaic power generation mode and the third output terminal and fourth output terminal output the power generated in the thermoelectric generation mode; and,
a control unit which controls the power generating apparatus.

5. The power generating system as claimed in claim 4, wherein the mode switching unit affects mode switching to the photovoltaic power generation mode by connecting the p-type semiconductor layers in parallel with each other and the n-type semiconductor layers in parallel with each other among the plurality of pn stacks.

6. The power generating system as claimed in claim 4, wherein the mode switching unit affects mode switching to the thermoelectric generation mode by connecting the p-type semiconductor layer and the n-type semiconductor layer in series between adjacent ones of the pn stacks.

7. The power generating system as claimed in claim 4, the mode switching unit affects mode switching to the thermoelectric generation mode by connecting the same polar semiconductor layers in series with each other so that the current flows through only the same polar semiconductor layers.

8. The power generating system as claimed in claim 4, wherein the mode switching unit includes a first switching device which is capable of connecting the p-type semiconductor layers in parallel with each other, a second switching device which is capable of connecting the n-type semiconductor layers in parallel with each other, and a third switching device which is capable of connecting the p-type semiconductor layer and the n-type semiconductor layer in series between different ones of the pn stacks or a fourth switching device which is capable of connecting the same polar semiconductor layers in series with each other so that the current flows through only the same polar semiconductor layers.

9. The power generating system as claimed in claim 4, wherein the control unit includes a switching decision unit which receives a first amount of power generated by the power generating apparatus in the photovoltaic power generation mode and a second amount of power generated by the power generating apparatus in the thermoelectric generation mode, compares the first amount of power to the second amount of power in order to select one mode which is capable of generating a larger amount of power, and instructs the mode switching unit to affect mode switching to the selected mode.

10. The power generating system as claimed in claim 4, wherein the control unit includes,
a light sensor which detects the amount of sunlight,
a temperature sensor which detects temperature, and,
a switching decision unit which selects one mode which is capable of generating a larger amount of power based on the light sensor output and the temperature sensor output and instructs the mode switching unit to affect mode switching to the selected mode.

11. The power generating system as claimed in claim 4, wherein the control unit includes a switching decision unit which instructs the mode switching unit to affect mode switching to the photovoltaic power generation mode when the voltage received from the power generating apparatus is equal to or higher than a predetermined threshold value, and instructs the mode switching unit to affect mode switching to the thermoelectric generation mode when the voltage received from the power generating apparatus is lower than the predetermined threshold value.

12. The power generating system as claimed in claim 4, comprising a power storage unit to store power generated by the power generating apparatus.

13. The power generating system as claimed in claim 4, comprising a storage unit which stores information used by the control unit to make the decision to switch to the photovoltaic power generation mode or to the thermoelectric generation mode.

14. The power generating apparatus as claimed in claim 1, wherein each of the plurality of pn stacks has a plurality of slits which prevent thermal conduction from the first end toward the second end in the longitudinal direction,
wherein the density of the plurality of slits becomes gradually larger from the first end toward the second end, or the plurality of slits become gradually larger in width from the first end toward the second end.

15. The power generating apparatus as claimed in claim 1, wherein the thickness of each of the plurality of pn stacks gradually decreases from the first end toward the second end in the longitudinal direction, and a heat storage medium is provided at the second end.

16. The power generating system as claimed in claim 4, wherein each of the plurality of pn stacks has a plurality of slits which prevent thermal conduction from the first end toward the second end in the longitudinal direction,
wherein the density of the plurality of slits becomes gradually larger from the first end toward the second end, or the plurality of slits become gradually larger in width from the first end toward the second end.

17. The power generating system as claimed in claim 4, wherein the thickness of each of the plurality of pn stacks gradually decreases from the first end toward the second end in the longitudinal direction, and a heat storage medium is provided at the second end.

18. The power generating apparatus as claimed in claim 1, further comprising:
a first rectifier which prevents the power generated in the photovoltaic power generation mode from flowing back to the third output terminal and fourth output terminal; and
a second rectifier which prevents the power generated in the thermoelectric generation mode from flowing back to the first output terminal and second output terminal.

19. The power generating system as claimed in claim 4, wherein the power generating apparatus further comprises:
a first rectifier which prevents the power generated in the photovoltaic power generation mode from flowing back to the third output terminal and fourth output terminal; and
a second rectifier which prevents the power generated in the thermoelectric generation mode from flowing back to the first output terminal and second output terminal.

20. The power generating apparatus as claimed in claim 1, wherein at least one of the first output terminal and second output terminal is transparent to light.

21. The power generating apparatus as claimed in claim 1, wherein at least one of the first output terminal and second output terminal comprises a comb-like electrode.

22. The power generating system as claimed in claim 4, wherein at least one of the first output terminal and second output terminal is transparent to light.

23. The power generating system as claimed in claim 4, wherein at least one of the first output terminal and second output terminal comprises a comb-like electrode.

24. The power generating apparatus as claimed in claim 1, wherein the third output terminal and fourth output terminal output have different size.

25. The power generating apparatus as claimed in claim 1, wherein at least one of the first output terminal and second output terminal comprises a plurality of comb-like electrodes and the density of the plurality of comb-like electrodes becomes gradually larger from the first end toward the second end in the longitudinal direction.

26. The power generating system as claimed in claim 4, wherein the third output terminal and fourth output terminal output have different size.

27. The power generating system as claimed in claim 4, wherein at least one of the first output terminal and second output terminal comprises a plurality of comb-like electrodes and the density of the plurality of comb-like electrodes becomes gradually larger from the first end toward the second end in the longitudinal direction.

* * * * *